United States Patent [19]

Kobatake

[11] Patent Number: 5,508,654
[45] Date of Patent: Apr. 16, 1996

[54] TRANSISTOR CIRCUITS WITH A TERMINAL FOR RECEIVING HIGH VOLTAGES AND SIGNALS

[75] Inventor: Hiroyuki Kobatake, Tokyo, Japan

[73] Assignee: NEC Corporation, Tokyo, Japan

[21] Appl. No.: 306,310

[22] Filed: Sep. 15, 1994

[30] Foreign Application Priority Data

Sep. 16, 1993 [JP] Japan .................. 5-229354

[51] Int. Cl.⁶ .................................. G04G 15/00
[52] U.S. Cl. .................... 327/534; 327/399; 327/398
[58] Field of Search ........................ 327/382, 362, 327/383, 387, 389, 391, 404, 534, 398, 399, 400, 401

[56] References Cited

U.S. PATENT DOCUMENTS

| | | | |
|---|---|---|---|
| 4,473,761 | 9/1984 | Peterson | 327/382 |
| 4,894,568 | 1/1990 | Paulin | 327/434 |
| 5,021,680 | 6/1991 | Zaw Win et al. | 327/434 |
| 5,081,371 | 1/1992 | Wong | 307/296.2 |
| 5,134,320 | 7/1992 | Perusse | 327/382 |
| 5,204,562 | 4/1993 | Pace | 327/382 |
| 5,245,230 | 9/1993 | Ohri et al. | 307/572 |

FOREIGN PATENT DOCUMENTS

| | | |
|---|---|---|
| 0346898 | 12/1989 | European Pat. Off. . |
| 0373620 | 6/1990 | European Pat. Off. . |
| 0499110 | 8/1992 | European Pat. Off. . |
| 62-125711 | 6/1987 | Japan . |

Primary Examiner—Timothy P. Callahan
Assistant Examiner—Jung Ho Kim
Attorney, Agent, or Firm—Young & Thompson

[57] ABSTRACT

A transistor circuitry keeps its constituent transistors from being forward biased to prevent injection of large currents into the transistor substrates, and like problems. The transistor circuitry achieves this result with a control circuit which generates a substrate control voltage and switching transistors which are prevented from receiving a high constant current voltage from an input terminal until the substrate control voltage is raised up to and held at a desired voltage level.

38 Claims, 11 Drawing Sheets

5,508,654

1

TRANSISTOR CIRCUITS WITH A TERMINAL FOR RECEIVING HIGH VOLTAGES AND SIGNALS

BACKGROUND OF THE INVENTION

The invention relates to transistor circuits, and more particularly to transistor circuits with a terminal receiving predetermined high voltages and electrical signals.

A typical conventional transistor circuitry with the terminal for receiving both the high voltage and the electrical signals will be described with reference to FIG. 1. The transistor circuitry has an input terminal 1 for receiving both the high voltage and the electrical signals, a signal output terminal 5 from which electrical signals are outputted and a high voltage output terminal 3 from which a high voltage is outputted. The transistor circuitry also has an input circuit 2 that is electrically connected in series between the input terminal 1 and the signal output terminal 5 for receiving the electrical signals from the input terminal 1 and subsequent supply of the output signals to the signal output terminal 5. The transistor circuitry further has an n-channel transistor 6 that is electrically connected between the input terminal 1 and the high voltage output terminal 3. The n-channel transistor 6 has a gate to which a control signal is applied, according to which the transistor 6 exhibits switching operations. The n-channel transistor has a substrate that is grounded.

Operations of the conventional transistor circuitry will subsequently be described. The n-channel transistor 6 serves as a switch. When the input terminal 1 receives a high voltage, the control signal is at a high level and is applied to the gate electrode 4 to have the switching transistor 6 turn on so that the high voltage that has been received by the input terminal 1 is transmitted through the switching transistor 6 to the high voltage output terminal 3. By contrast, when the input terminal 1 receives electrical signals, the control signal is at a low level and is applied to the gate electrode 4 to have the switching transistor 6 turn off so that the electrical signals are supplied into the input circuit 2 and subsequently output from the signal output terminal 5.

The above described conventional transistor circuitry has a serious problem as described below. The above circuitry requires that the n-channel switching transistor be designed to have a considerable large channel width for an appreciable reduction of a voltage drop caused by the switching transistor. The large channel width of the switching transistor 6 necessitates a large occupation area of the switching transistor. This provides a difficulty in achieving a high density integration of the transistor circuits. The above circuitry further requires a booster such as a charge pump that generates a high control voltage to be applied to the gate electrode of the switching transistor 6, although an illustration of the booster or the charge pump is omitted. The booster or the charge pump also occupies a large area. This also provides a difficulty in achieving a high density integration of the transistor circuits.

To combat the above problem, another conventional transistor circuitry has been proposed, descriptions of which will be made with reference to FIG. 2A. This conventional transistor circuitry has an input terminal 10 for receiving a high voltage and electrical signals, a signal output terminal 12 from which electrical signals are outputted and a high voltage output terminal 14 from which a high voltage is outputted, in addition a power source voltage terminal 16 to which a power source voltage is applied. This conventional

2 transistor circuitry has an input circuit 11 that is electrically connected in series between the input terminal 10 and the signal output terminal 12 for receiving the electrical signals from the input terminal 10 and for the subsequent supply of output signals to the signal output terminal 12. The transistor circuitry further has first and second n-channel transistors 21 and 22, both of which are electrically connected in series between the input terminal 10 and the power source voltage terminal 16. The transistor circuitry also has a charge pump 18 that is connected to a gate of the first n-channel transistor 21 for supplying a high voltage control signal S21 to the gate of the first n-channel transistor 21. The first n-channel transistor 21 has a source electrically connected to the input terminal 10 and a source electrically connected to an intersection 20, while the second n-channel transistor 22 has a gate receiving a control signal S22, a drain that is electrically connected to the intersection 20 and a source that is electrically connected to the power source voltage terminal 16. The power source voltage terminal 16 is applied with a power source voltage $V_{dd}$. The first and second n-channel transistors 21 and 22 have substrates that are grounded to provide a ground potential to the substrate. The transistor circuitry also has a third p-channel transistor 23 that is electrically connected in series between the input terminal 10 and the high voltage output terminal 14. The third p-channel transistor has a gate receiving a control signal S23, a source that is electrically connected to the input terminal 10 and a drain that is electrically connected to the high voltage output terminal 14. A substrate of the third p-channel transistor is electrically connected to the intersection 20 to provide a voltage $V_{sub}$ of the intersection 20 to the substrate of the third p-channel transistor 23.

Descriptions will subsequently focus on the operation of the conventional transistor circuitry with reference to FIGS. 2A and 2B. The input terminal receives an electrical signal, a voltage of which is in the range of from the ground potential to the same voltage as the power source voltage $V_{dd}$ as well as the high voltage $V_{pp}$. The charge pump 18 may generate a higher voltage V than the voltage $V_{dd}$.

The operations of the transistor circuitry are as follows, assuming that the input terminal receives the electrical signals in the range of from ground to the voltage $V_{dd}$. The control signal S21 supplied from the charge pump 18 is at a low level or a ground potential and is applied to the gate electrode of the first n-channel transistor 21 to have the first n-channel transistor 21 turn off. By contrast, the control signal 22 is at a high level or the voltage $v_{dd}$ and is applied to the gate electrode of the second n-channel transistor 22 to turn it on so that the power source voltage $V_{dd}$ of the power source voltage terminal 16 is supplied through the second n-channel transistor 22 and the intersection 20 to the substrate of the third p-channel transistor 23. Thus, the substrate voltage $V_{sub}$ of the third p-channel transistor 23 is held at the same voltage as the power source voltage $V_{dd}$. The control signal S23 of the third p-channel transistor 23 is at a high level or the same voltage as the power source voltage $V_{dd}$ and is applied to the gate electrode of the third p-channel transistor 23 to have the p-channel transistor 23 turn off so that the output voltage OUT14 of the high voltage output terminal 14 is kept at the same voltage as the power source voltage $V_{dd}$, while the electrical signals are supplied through the input circuit 11 to the signal output terminal 12 so that a signal output voltage OUT12 appears at the signal output terminal 12 in which a wave form of the output signal OUT12 is analogous to the input signals.

On the other hand, operations of the above transistor circuitry when the input terminal receives the high voltage $V_{pp}$ are different form those when the input terminal receives the electrical signals.

When the input terminal 10 receives the high constant voltage $V_{pp}$, a clock signal CLOCK is supplied to the charge pump 10 in which a voltage of the clock signal is in the range of from the ground potential to the same voltage as the power source voltage. The charge pump that has received the clock signal CLOCK supplies the gate electrode of the first n-channel transistor 21 with a control signal of a higher voltage level $V_h$ than the high voltage $V_{pp}$ to have the first n-channel transistor 21 turn on so that the high voltage $V_{pp}$ is supplied to the intersection 20 through the first n-channel transistor 21. By contrast, the control signal S22 that is applied to the gate electrode of the second n-channel transistor 22 switches into a low level or the ground potential to have the second n-channel transistor 22 turn off. As illustrated in FIG. 2B, the voltage level of the control signal applied to the gate of the first n-channel transistor 21 is, however, not rapidly raised up to the higher voltage level $V_h$. Then, a time T elapses until the turning on of the first n-channel transistor 21 is completed by raising the control signal voltage level S21 over a threshold voltage of the gate electrode of the first n-channel transistor. The substrate voltage $V_{sub}$ of the third p-channel transistor S23 is not rapidly raised from the power source voltage $V_{dd}$ up to the high voltage $V_{pp}$ during the time interval T and thereafter is held at the high voltage $V_{pp}$. The control signal S23 to be applied to the gate electrode of the third p-channel transistor S23 switches to a low level of the ground voltage to have the third p-channel transistor S23 turn on so that the high voltage $V_{pp}$ of the input terminal 10 is supplied through the third p-channel transistor 23 to the high voltage output terminal 14, thereby the output voltage of the high voltage output terminal 14 is not rapidly raised up and held at the high voltage $V_{pp}$. The switching on state of the third transistor 23 may prevent the high voltage $V_{pp}$ from being supplied to the input circuit 11 thereby an intermediate voltage between the ground voltage and the high voltage $V_{pp}$ appears at the signal output terminal 12.

In view of the circuit design, it is very important to prevent any forward bias between the source and the substrate of any transistors. Namely, it must be prevented that in any transistor an n-type region is applied with a high voltage, while a p-type region is applied with a low voltage. Once any of the transistors is forward biased, a large amount of an electrical current flows through the source region to the substrate thereby a large amount of carriers is injected into the substrate. This may cause an error in operations of the transistor circuits or a latch up. In the above transistor circuitry, the transistor circuits are formed of a p-type semiconductor substrate with an n-type well region in which the p-channel transistor 23 is formed. When the input terminal 10 receives the electrical signals whose voltage level is in the range of form the ground voltage to the same voltage of the power source voltage $V_{dd}$, the substrate voltage of the third p-channel transistor 23 is held at the power source voltage $V_{dd}$ supplied from the power source voltage terminal 16 through the second n-channel transistor 22 in order to prevent a forward bias between the source and substrate of the third p-channel transistor 23. However, the above conventional transistor circuits have the following problems. As described above, the voltage applied to the input terminal 10 is rapidly raised up to the high voltage $V_{pp}$ from the input signal. Then, the voltage applied to the source of the third p-channel transistor 23 is also rapidly raised up to the high voltage $V_{pp}$. Notwithstanding, the substrate voltage of the third p-channel transistor 23 is not rapidly raised up to the high voltage $V_{pp}$ from the same voltage of the power source voltage $V_{dd}$ during the time interval T. This is caused by a high internal impedance of the charge pump 18. Such high internal impedance of the charge pump 18 causes a delay in raising the control signal voltage applied to the gate electrode of the first n-channel transistor 21. This delay in raising the control signal voltage S21 causes a delay in the completion of the turning on of the first n-channel transistor 21 thereby the raising of the substrate voltage of the third p-channel transistor 23 is delayed by the time interval T. Then, during the time interval T after the electric signal was changed into the high voltage $V_{pp}$, the substrate voltage $V_{sub}$ of the third p-channel transistor 23 is smaller than the high voltage $V_{pp}$ applied to the source of the third p-channel transistor 23. This means that the third p-channel transistor 23 is forward-biased between its source and substrate thereby a large amount of carriers is injected into the substrate of the third p-channel transistor 23. Namely, a large amount of the electric current flows through the input terminal 10 to the substrate of the third p-channel transistor 23. This may cause an error in the operation or the latch up thereby resulting in an unoperational state or a broken state of the transistor circuits.

To combat this serious problem, it was proposed to provide a resistance between the input terminal 10 and the third p-channel transistor for suppressing a considerable large amount of the current through the input terminal 10 into the substrate of the third p-channel transistor 23 as illustrated in FIG. 3. This alternative conventional transistor circuitry, however, faces another problem in a voltage drop of the high voltage output terminal 14. When the input terminal receives the high voltage $V_{pp}$, the high voltage $V_{pp}$ is transmitted through the resistor R and the third transistor 23 to the high voltage output terminal 14. The resistor R causes the voltage drop from the high voltage $V_{pp}$ thereby resulting in a voltage drop of the output voltage at the high voltage output terminal 14. This makes it difficult to fetch a required large amount of the electrical current from the high voltage output terminal 14.

The conventional transistor circuits as illustrated in FIGS. 2A and 3 have a further problem of large power consumption. As described above, the conventional transistor circuitry requires the charge pump 18 to generate the voltage $V_h$ which is higer than the high voltage $V_{pp}$ to be applied to the gate of the first n-channel transistor 21. For that purpose, the charge pump requires a power for generating the clock signal to be inputted to the charge pump as well as a power to be used for driving the charge pump 18. Those extra powers for the charge pump 18 provides an enlargement of the power consumption. The charge pump further occupies a relatively large area in the transistor circuit. Furthermore, the requirement of the application of the higher voltage $V_h$ to the gate electrode of the first n-channel transistor 21 provides a further requirement for the first n-channel transistor 21 to have a high voltage resistivity. This requires a complicated fabrication process for the transistor circuits.

To settle the above serious problems, it has been required to develop a quite novel transistor circuitry free from any problems as described above.

SUMMARY OF THE INVENTION

Accordingly, it is a primary object of the present invention to provide a novel transistor circuitry with an input terminal for receiving electrical signals and high voltages, that is free from any problems as mentioned above.

It is a further object of the present invention to provide a novel transistor circuitry with an input terminal for receiving electrical signals and high voltages, that permits any carrier injection from the input terminal into the substrate of the transistor circuits.

It is a still further object of the present invention to provide a novel transistor circuitry with an input terminal for receiving electrical signals and high voltages, that is in the form of operational errorless transistor circuits.

It is yet a further object of the present invention to provide a novel transistor circuitry with an input terminal for receiving electrical signals and high voltages, that is free from any latch up.

It is a furthermore object of the present invention to provide a novel transistor circuitry with an input terminal for receiving electrical signals and high voltages, that is free from any voltage drop of a required high voltage to be fetched from an output terminal.

It is a moreover object of the present invention to provide a novel transistor circuitry with an input terminal for receiving electrical signals and high voltages, that permits a high integration of the transistor circuits.

It is an additional object of the present invention to provide a novel transistor circuitry with an input terminal for receiving electrical signals and high voltages, that permits a reduction of a power consumption by the transistor circuits.

The above and other objects, features and advantages of the present invention will be apparent from the following descriptions.

The invention provides a novel transistor circuitry with a sole input terminal for receiving both electrical signals and high voltages.

The invention provides a transistor circuitry comprising: an input terminal for receiving both an input signal having a voltage in the range from a first voltage level and a second voltage level higher than the first voltage level and for subsequent receipt of a high constant voltage having a third voltage level higher than the second voltage level; a first output terminal through which an output signal is outputted; an input circuit electrically connected between the input terminal and the first output terminal for fetching the input signal from the input terminal and subsequent supplying of the output signal to the output terminal; a second output terminal through which the high constant voltage having the third voltage level is outputted; a power source voltage terminal through which a power source voltage having the same voltage level as the second voltage level is supplied; a control circuit electrically connected between the input terminal and the power source voltage terminal for generating a substrate control voltage that is held in the second voltage level when receipt of the input signal by the intput terminal and subsequent gradual increase of the substrate control voltage up to the third voltage level when the input signal switches into the high constant voltage to hold the substrate control voltage at the third voltage level; a first switching transistor electrically connected to the second output terminal, the first switching transistor having a substrate that is electrically connected to the control circuit for receiving the substrate control voltage; and a second switching transistor electrically connected between the input terminal and the first switching transistor to transmit the high constant voltage from the input terminal through the first and second switching transistors to the second output terminal wherein the second switching transistor is so controlled as to be held in an off state to prevent the first switching transistor from receiving the high constant voltage until the substrate control voltage is raised up to and then held at the third voltage level. The first switching transistor is so controlled as to be held in an off state until the substrate control voltage is raised up to and then held at the third voltage level. The first and second transistors are p-channel transistors. The first switching transistor receives a first gate control signal that is held in a high level corresponding to the second voltage level until the substrate control voltage is raised up to and then held at the third voltage level and subsequent switch of the first gate control signal into a low level corresponding to the first voltage level. The second switching transistor receives a second gate control signal having a various voltage level that is not higher than the second voltage level but higher than a threshold voltage of the second switching transistor to keep the second switching transistor turned off and to subsequent switch of the voltage level of the second gate control signal into the third voltage level to further keep the off state of the second switching transistor until the substrate control voltage is raised up to and then held at the third voltage level, followed by a drop of the voltage level of the second gate control signal down to the first voltage level. The second switching transistor has a substrate that is electrically connected to the input terminal.

BRIEF DESCRIPTIONS OF THE DRAWINGS

Preferred embodiments of the present invention will hereinafter be described in detail with reference to the accompanying drawings.

PREFERRED EMBODIMENTS OF THE INVENTION

Figure 1:
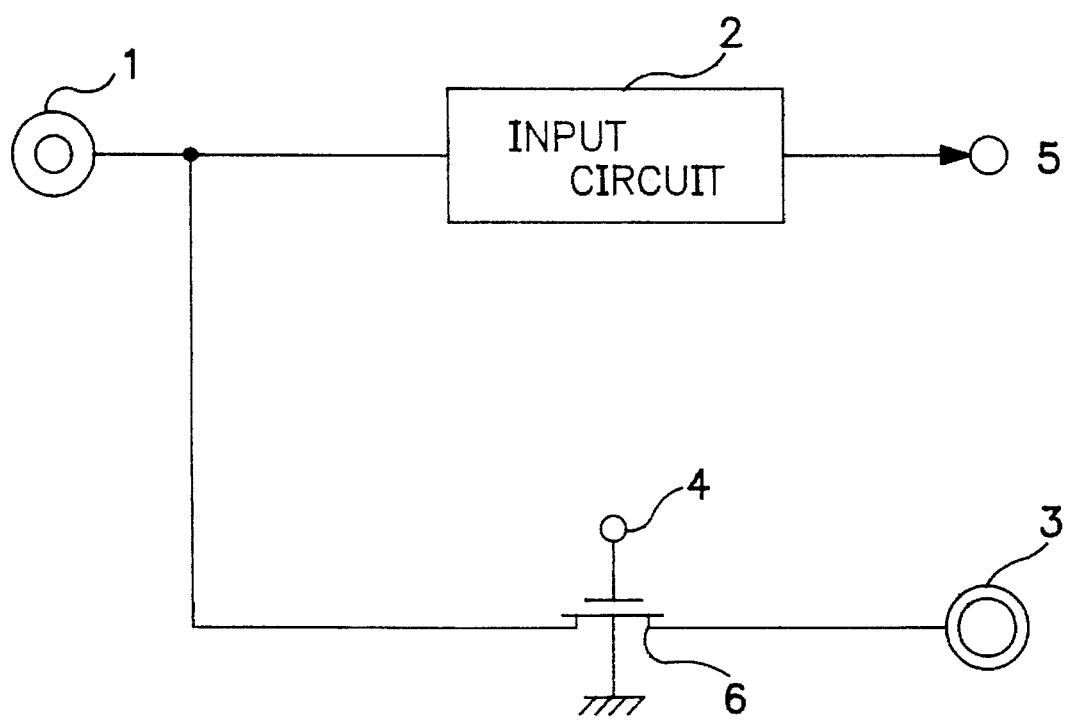
FIG. 1 is a circuit diagram illustrative of the conventional transistor circuits with a single input circuit for receiving both electrical signals and a high voltage.
Figure 2A:
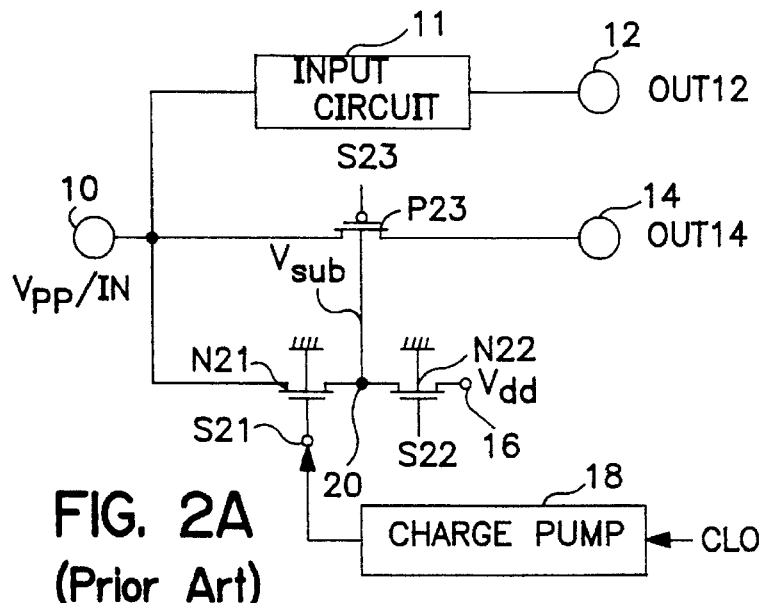
FIG. 2A is a circuit diagram illustrative of the another conventional transistor circuits with a single input circuit for receiving both electrical signals and a high voltage.
Figure 2B:
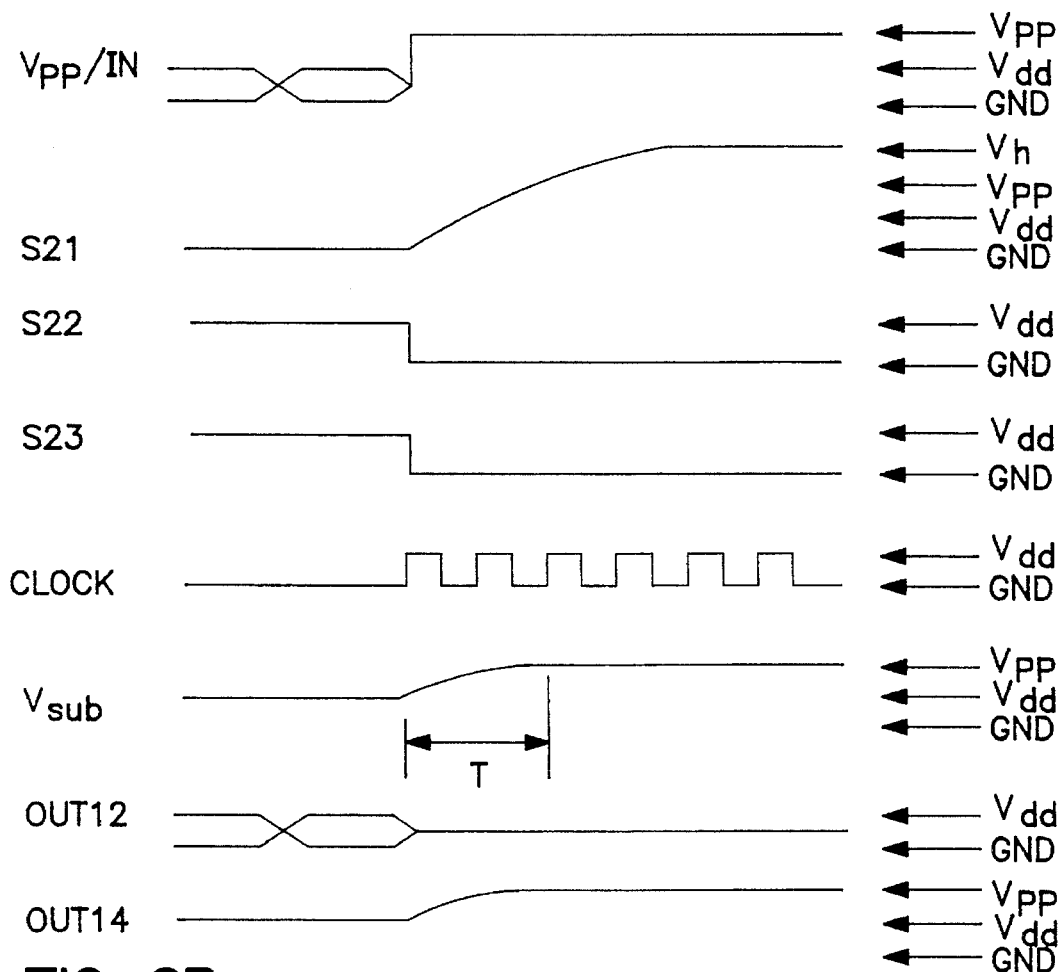
FIG. 2B is a diagram illustrative of voltage waveforms of individual voltages that appear in the another conventional transistor circuits as illustrated in FIG. 2A.
Figure 3:
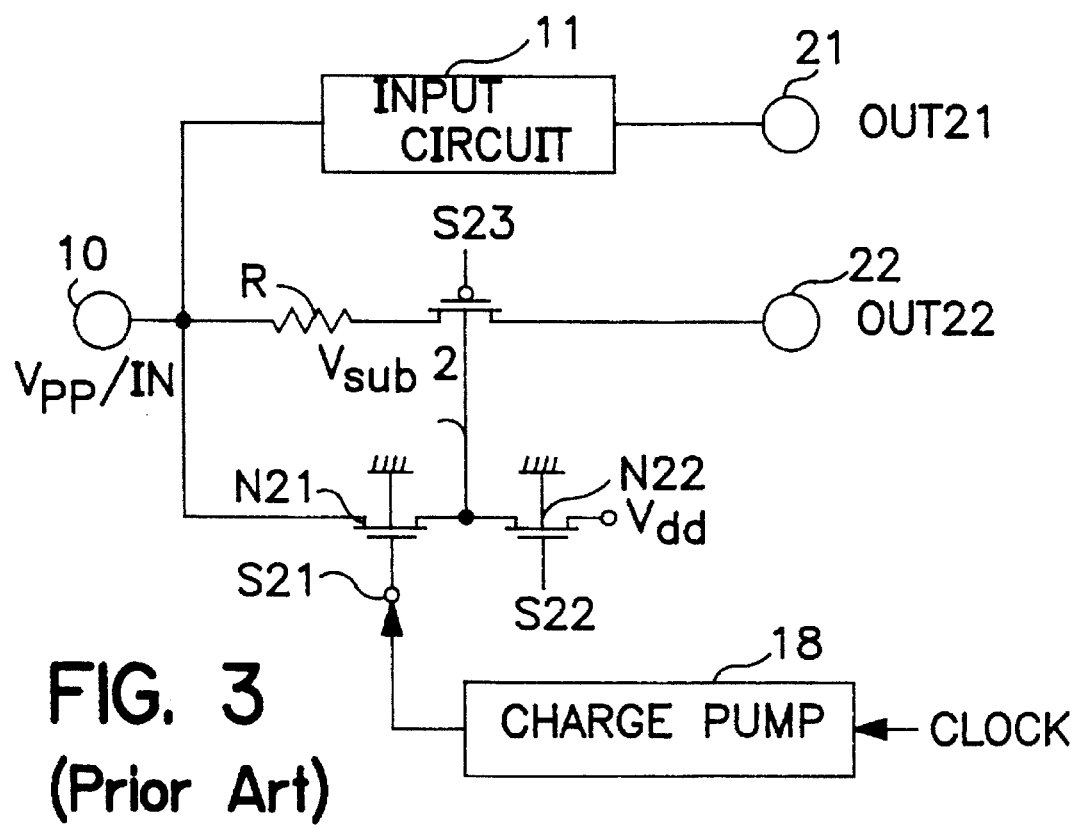
FIG. 3 is a circuit diagram illustrative of another conventional transistor circuit with a single input circuit for receiving both electrical signals and a high voltage.

A first embodiment according to the present invention will be described with reference to FIGS. 4A, 4B, 5A and 5B in which a novel transistor circuitry with a single input terminal for receiving electrical signals and a high voltage is provided.

The novel transistor circuit of this embodiment has an input terminal 10 for receiving both electrical signals and a high voltage $V_{pp}$, a signal output terminal 22 from which electrical signals are outputted, a high voltage output terminal 24 from which a high output voltage is outputted and a power source voltage terminal 26 through which a power source voltage $V_{dd}$ is supplied to the transistor circuitry. The novel transistor circuitry has an input circuit 21 that is electrically connected between the input terminal 10 and the signal output terminal 22 for receiving the electrical signals from the input terminal 10 to supply the output signals to the output terminal 22. The novel transistor circuitry also has first to fifth p-channel transistors 11 to 15 acting as switches among the input terminal 10, the high voltage output terminal 24 and the power source voltage terminal 26. The first to third p-channel transistors 11 to 13 are electrically connected in series between the input terminal and the power source voltage terminal. The first p-channel transistor 11 has a source that is electrically connected to the input terminal 10, a drain that is electrically connected to a drain of the second p-channel transistor 12, a gate electrode for receiving a control signal S11 and a substrate that is electrically connected to the input terminal 10. The second p-channel transistor 12 has a source that is electrically connected to an intersection 20, the drain that is electrically connected to the drain of the first p-channel transistor 11, a gate electrode that is electrically connected to the gate electrode of the first p-channel transistor for receiving the first electrical signal S11 and a substrate that is electrically connected to the intersection 20. The third p-channel transistor 13 has a source that is electrically connected to the intersection 20, a drain that is electrically connected to the power source voltage terminal 26, a gate electrode for receiving a second control signal S12 and a substrate that is electrically connected to the intersection 20. The fourth p-channel transistor 14 has a source that is electrically connected to the input terminal 10, a drain that is electrically connected to a source of the fifth p-channel transistor 15, a gate electrode for receiving a third control signal S13 and a substrate that is electrically connected to the input terminal 10. The fifth p-channel transistor 15 has the source that is electrically connected to the drain of the fourth p-channel transistor 14, a drain that is electrically connected to the high voltage output terminal 24, a gate electrode for receiving a fourth control signal S14 and a substrate that is electrically connected to the intersection 20.

Figure 4A:
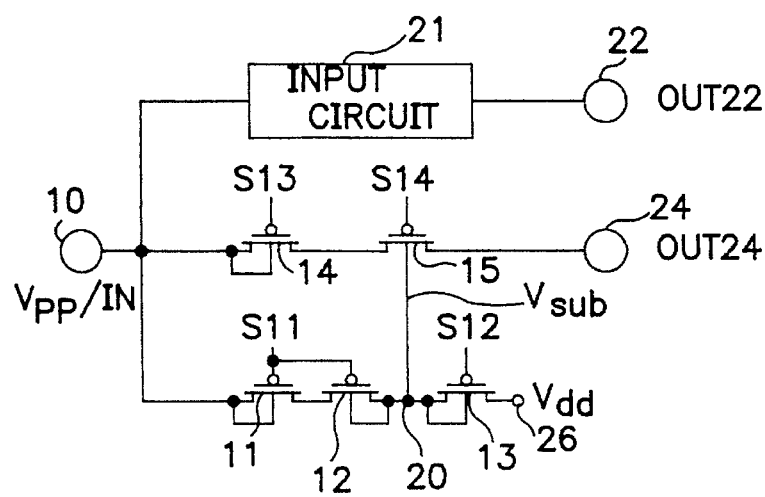
FIG. 4A is a circuit diagram illustrative of a novel transistor circuitry with a single input circuit for receiving both electrical signals and a high voltage in a first embodiment according to the present invention.
Figure 4B:
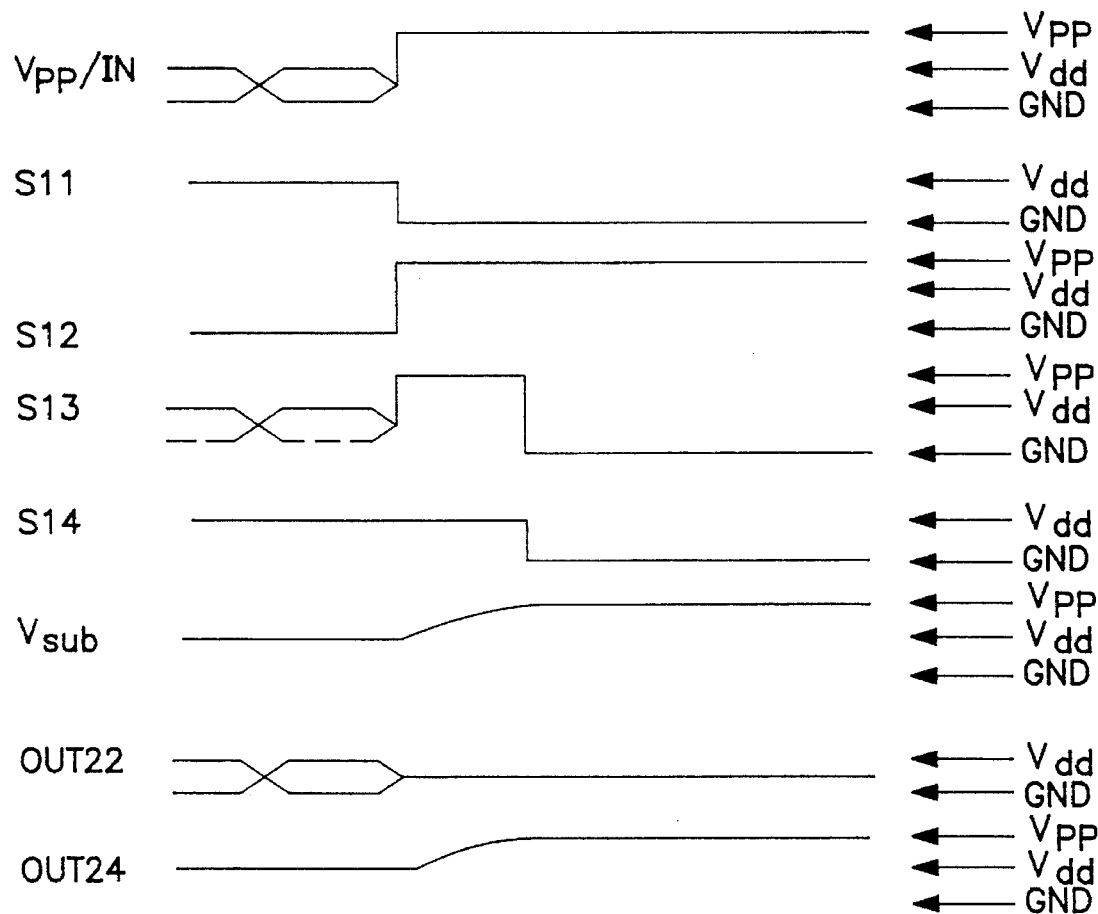
FIG. 4B is a diagram illustrative of voltage waveforms of individual elements involved in the novel transistor circuitry of FIG. 4A.

The descriptions will subsequently focus by referring to FIGS. 4A and 4B on operations of the above transistor circuitry when the input terminal 10 receives the electrical signals. The voltage of the electrical signals is in the range of from the ground voltage to the same voltage as the power source voltage $V_{dd}$. The first control signal S11 to be applied to the gate electrodes of the first and second p-channel transistors 11 and 12 is held at a high level corresponding to the same voltage as the power source voltage $V_{dd}$ to have the first and second p-channel transistors 11 and 12 turn off. By contrast, the second control signal S12 to be applied to the gate electrode of the third p-channel transistor 13 is held at a low level corresponding to the ground voltage to cause the third p-channel transistor 13 to turn on so that the power source voltage $V_{dd}$ of the power source voltage terminal 26 is supplied through the third p-channel transistor 13 and the intersection 20 to the substrate of the fifth p-channel transistor 15. Then, the substrate voltage of the fifth p-channel transistor 15 is held at the same voltage as the power source voltage $V_{dd}$. The third control signal S13 to be applied to the gate electrode of the fourth p-channel transistor 14 is almost the same as the electrical signals applied to the input terminal 10, provided that the voltage of the third control signal is more than the ground voltage to maintain the off-state of the fourth p-channel transistor 14. The broken line of the third control signal in FIG. 4B represent that the voltage of the third control signal does not include the ground voltage. The fourth control voltage to be applied to the gate electrode of the fifth p-channel transistor 15 is held at the same voltage as the power source voltage $V_{dd}$ to cause the fifth p-channel transistor to turn off so that the output voltage OUT24 of the high voltage output terminal 24 is held at the same voltage as the power source voltage $V_{dd}$. Thus, the inputted signals OUT22 of the input terminal 10 are supplied to the input circuit 21 to be outputted through the signal output terminal 22.

When the input terminal 10 receives the high voltage $V_{pp}$, the operation of the above transistor circuits is different from the operation as described above. The voltage applied to the input terminal switches into and held at the high voltage $V_{pp}$. The first control signal S11 to be applied to the gate electrodes of the first and second p-channel transistors 11 and 12 switches into a low level corresponding the ground potential to cause the first and second p-channel transistors 11 and 12 to turn on so that the high voltage $V_{pp}$ of the input terminal 10 is supplied through the first and second p-channel transistors 11 and 12 to the intersection 20. By contrast, the second control signal S12 to be applied to the third p-channel transistor 13 switches into the high voltage $V_{pp}$ to cause the third p-channel transistor 13 to turn off. Then, the high voltage $V_{pp}$ of the input terminal 10 is supplied through the intersection 20 to the substrate of the fifth p-channel transistor 15 so that the substrate voltage is not rapidly raised up to and then held at the high voltage $V_{pp}$. The third control signal S13 to be applied to the gate electrode of the fourth p-channel transistor 14 switches into and held at a high level corresponding to the high voltage $V_{pp}$ to maintain the off state of the fourth p-channel transistor 14 at least until the substrate voltage $V_{sub}$ of the fifth p-channel transistor 15 is raised up to the high voltage $V_{pp}$. After the substrate voltage $V_{sub}$ of the fifth p-channel transistor 15 was raised up and then held at the high voltage $V_{pp}$, the third control signal S13 switches from the high voltage $V_{pp}$ to a low level corresponding to the ground voltage to cause the fourth p-channel transistor 14 to turn on so that the high voltage of the input terminal 10 is supplied through the fourth p-channel transistor 14 to the source of the fifth p-channel transistor 15. The fourth control signal S14 to be applied to the fifth p-channel transistor 15 keeps the same voltage as the power source voltage $V_{dd}$ to maintain the off state of the fifth p-channel transistor 15 at least until the substrate voltage $V_{sub}$ of the fifth p-channel transistor 15 is raised up to the high voltage $V_{pp}$. After the substrate voltage $V_{sub}$ of the fifth p-channel transistor 15 was raised up and then held at the high voltage $V_{pp}$, the fourth control signal S14 kept at the same voltage as the power source voltage $V_{dd}$ switches to a low level corresponding to the ground voltage to cause the fifth p-channel transistor 15 to turn on so that the high voltage of the input terminal 10 is supplied through the fourth and fifth p-channel transistors 14 and 15 to the high voltage output terminal 24. As illustrated in FIG. 4B, the fourth control signal S14 to be applied to the gate electrode of the fifth p-channel transistor 15 switches to the ground voltage at the same time of the switching to the ground voltage of the third control signal S13 to be applied to the fourth p-channel transistor 14 so that the fourth and fifth p-channel transistor turn on at the same time. The output voltage OUT24 of the high voltage output terminal 24 is held at the same voltage as the power source voltage $V_{dd}$ until the third and fourth control signals S13 and S14 drop down to the ground voltage or until the fourth and fifth p-channel transistors 14 and 15 turn on, and thereafter are gradually raised up to and then held at the high voltage $V_{pp}$. By contrast, the output voltage OUT22 of the signal output terminal 22 is held at a half voltage between the ground voltage and the power source voltage $V_{dd}$ after the the first control signal S11 switches into the low level or the ground voltage to be applied to the gate electrode of the first and second p-channel transistors 11 and 12 to cause both transistors 11 and 12 to turn on.

The above transistor circuitry permits any of the first to fifth p-channel transistors to be free from any forward bias between the source and substrate. Each of the first to fourth p-channel transistors 11 to 14 has the same substrate voltage as the voltage applied to the source. This may prevent the forward bias between the source and substrate regardless of any of the input signals and the high voltage to be applied to the input terminal 10. Further, the second p-channel transistor 12 was designed to prevent any forward bias between the drain and the substrate. The p-n junction between the drain and the substrate causes a built-in potential so that the p-type region as the drain has the higher potential than a potential of the n-type region as the substrate. The difference in the potential between the p-type and n-type regions or between the drain and the substrate corresponds to the built-in potential. For the second p-channel transistor 12, the drain of the p-type region has a higher potential by the built-in potential than the substrate voltage that is the same as a potential of the drain and the intersection 20. To prevent the second p-channel transistor 12 from any forward bias between the drain and the substrate, the second p-channel transistor 12 is designed to have an extremely small on-state resistance as compared to an on-state resistance of the first p-channel transistor 11. From the above descriptions, it could be understood that the first to fourth p-channel transistors 11 to 14 are allowed to be free from any forward bias.

On the other hand, the fifth p-channel transistor 15 is also allowed to be free from any forward bias. When the input terminal 10 receives the input signals, the fourth p-channel transistor 14 provided between the input terminal 10 and the fifth p-channel transistor 15 is held in the off state, while the substrate of the fifth p-channel transistor 15 is applied with the power source voltage $V_{dd}$ as described above. Accordingly, when the input terminal 10 receives the input signals, the fifth p-channel transistor 15 is allowed to be free from any forward bias. After the input signals applied to the input terminal 10 switches into the high voltage $V_{pp}$, the fourth and fifth p-channel transistors are still kept in the off state until the substrate voltage $V_{sub}$ of the fifth p-channel transistor 15 is gradually raised up to the high voltage $V_{pp}$. In the meantime, the off state of the fourth p-channel transistor 14 may keep the source of the fifth p-channel transistor 15 from the high voltage $V_{pp}$, while the substrate voltage $V_{sub}$ of the fifth p-channel transistor 15 is being raised up to the high voltage $V_{pp}$ thereby the fifth p-channel transistor is allowed to be free from the forward bias between the source and the substrate. After the substrate voltage $V_{sub}$ of the fifth p-channel transistor 15 has been raised up to and then held at the high voltage $V_{pp}$, the fourth and fifth p-channel transistors 14 and 15 are allowed to turn on so that the source of the fifth p-channel transistor 15 is applied with the high voltage $V_{pp}$. Then, the fifth p-channel transistor 15 is also allowed to be free from any forward bias or the forward bias between the source and the substrate.

From the above descriptions, it could therefore no doubt be appreciated that the novel transistor circuitry of this embodiment may permit any of the first to fifth p-channel transistors 11 to 15 to be free from any forward bias. This further may prevent any large current injection into the substrate caused by the forward bias of the transistors. The above transistor circuitry is allowed to be free from any issues caused by the large current injection such as the latch up or any operational error of the circuits. Needless to say, the above novel transistor circuitry is allowed to be free from any broken state caused by the large current injection into the substrate. The above novel transistor circuitry never includes any resistance between the input terminal 10 and the high voltage output terminal 24. This may keep the output voltage OUT24 at the high voltage output terminal 24 from any issue such as any voltage drop. Moreover, the novel transistor circuitry is allowed to be free from the requirement for use of any booster circuit such as a charge pump unlike the conventional transistor circuitry. This may provide the transistor circuits with valuable advantages in permitting the high integration and a considerable reduction of the power consumption, In this embodiment, the second and third control signals S12 and S13 including the high level corresponding to the high voltage $V_{pp}$ may be generated by a level shifter as described below with reference to FIGS. 5A, 5B and 5C, A level shifter is provided for each of the second and third control signals S12 and S13. The level shifter is provided between the input terminal 10 and each of the gate electrodes of the third and fourth p-channel transistors 13 and 14 illustrated in FIG. 4. The level shifter has a circuit configuration as described below. The level shifter has an input signal terminal 30 for receiving an input signal IN30 and an output signal terminal 31 that is electrically connected to each of the gate electrodes of the third and fourth p-channel transistors 13 and 14 for transmitting the control signal S12 or S13 thereto. The level shifter includes p-channel transistors 32 and 33 and n-channel transistors 34 and 35 as well as an invertor 36. The invertor 36 is electrically connected at its input side to the input signal terminal 30 and connected at its output side to a gate of the n-channel transistor 35. The n-channel transistor 35 is electrically connected between said output signal terminal 31 and a ground line. The n-channel transistor 34 has a substrate electrically connected to the ground line. The p-channel transistor 33 is electrically connected between the input terminal 10 and the output signal terminal 31. The p-channel transistor 33 has a substrate electrically connected to the input terminal 10. The n-channel transistor 34 is electrically connected between the ground line and a gate of the p-channel transistor 33. The n-channel transistor 34 has a substrate electrically connected to the ground line and a gate electrically connected to the input signal terminal 30. The p-channel transistor 32 is electrically connected between the input terminal 10 and the gate of the p-channel transistor 33. The p-channel transistor 32 has a substrate electrically connected to the input terminal and a gate electrically connected to the output signal terminal 31.

Figure 5A:
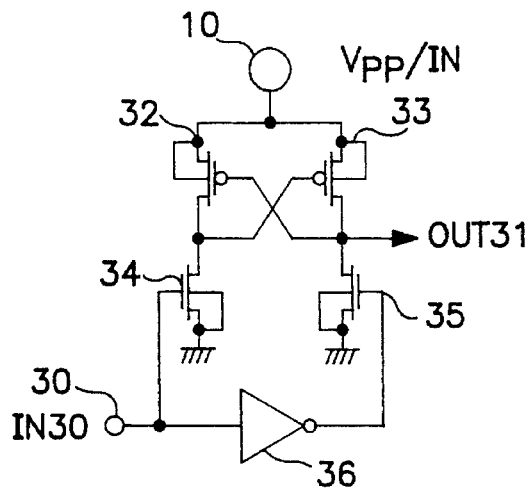
FIG. 5A is a circuit diagram illustrative of a level shifter used in a novel transistor circuitry according to the present invention.
Figure 5B:
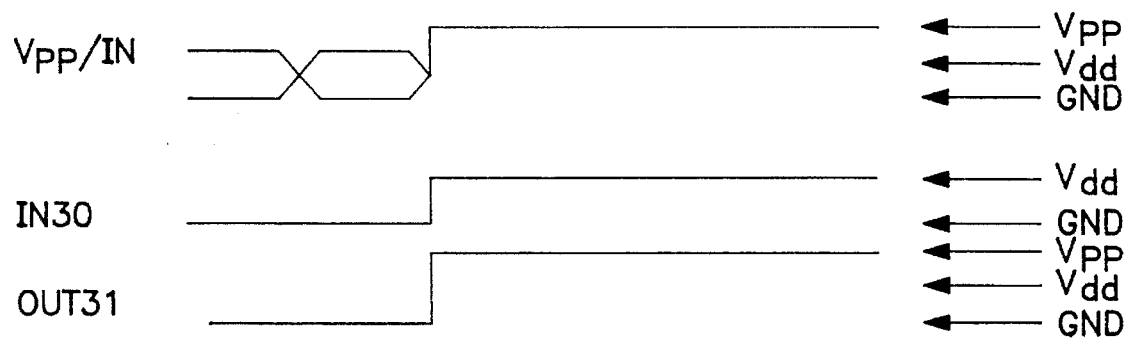
FIGS. 5B and 5C are diagrams illustrative of voltage waveforms of individual elements involved in the level shifter of FIG. 5A.

The description will focus with reference to FIGS. 5A and 5B on operations of the level shifter to be used for supplying the second gate control signal to the gate electrode of the third p-channel transistor 13. When the input terminal receives the electric signal, the input signal terminal 30 receives a constant low voltage corresponding to the ground voltage to apply the low level voltage to the gate of the n-channel transistor 34 so that the n-channel transistor 34 turns off. The low level voltage is also supplied to the invertor to be inverted into a high level voltage that is subsequently transmitted to the gate of the n-channel transistor 34 so that the fourth n-channel transistor turns on thereby a ground voltage is supplied from the ground line through the n-channel transistor 35 to the output signal terminal 31. The gate of the p-channel transistor 32 connected to the output signal terminal 31 is applied to the ground voltage so that the first p-channel transistor turns on thereby the electrical signal is supplied from the input terminal 10 through the p-channel transistor 32 to the gate of the p-channel transistor 32 to cause the p-channel transistor 32 to turn off, resulting in that the output signal terminal 31 has the ground voltage when the input terminal 10 receives the input signal.

When the input terminal receives the constant high voltage, the input signal terminal 30 receives a constant high voltage corresponding to the same level as the power source voltage to apply the high level voltage to the gate of the n-channel transistor 34 so that the n-channel transistor 34 turns on thereby the ground voltage is supplied through the n-channel transistor 34 to the gate of the p-channel transistor 33. Then, the p-channel transistor 33 turns on so that the high voltage is supplied from the input terminal 10 through the p-channel transistor 33 to the output signal terminal 31. The gate of the p-channel transistor 32 electrically connected to the output signal terminal 31 is applied with the high voltage to have the p-channel transistor 32 turn on. The high level voltage is also supplied to the invertor to be inverted into the low level voltage that is subsequently applied to the gate of the n-channel transistor 35 to have the n-channel transistor 35 turn off. Accordingly, the output signal terminal 31 has the high voltage $V_{pp}$ when the input terminal 10 receives the constant high voltage.

Figure 5C:
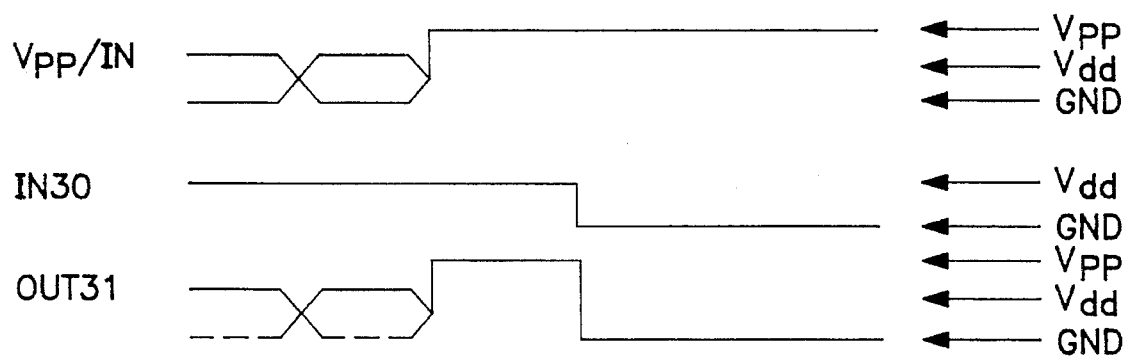

The description will focus with reference to FIGS. 5A and 5C on operations of the level shifter to be used for supplying the third gate control signal to the gate electrode of the fourth p-channel transistor 14. When the input terminal receives the electric signal, the input signal terminal 30 receives a constant high voltage corresponding to the same level as the power source voltage to apply the high level voltage to the gate of the n-channel transistor 34 so that the n-channel transistor 34 turns on. Then, the ground voltage is supplied from the ground line through the n-channel transistor 34 to the gate of the second p-channel transistor 33. Then, the p-channel transistor 33 turns on so that the input signal is supplied from the input terminal 10 through the p-channel transistor 33 to the output signal terminal 31. The high level voltage is also supplied to the invertor 36 to be inverted into the low level voltage that is subsequently applied to the gate of the n-channel transistor 34 to have the n-channel transistor 34 turn off. Then, the output signal terminal 31 has the signal whose voltage level is in the range of from the power source voltage level and the threshold voltage level.

When the input terminal receives the constant high voltage, the input signal terminal 30 still receives the same voltage level as the power source voltage until the substrate voltage $V_{sub}$ of the fifth switching transistor is raised up to and then held at the high voltage $V_{pp}$. In the meantime, the high level voltage is applied to the gate of the n-channel transistor 34 so that the n-channel transistor 34 turns on thereby the ground voltage is supplied through the n-channel transistor 34 to the gate of the p-channel transistor 33. Then, the p-channel transistor 33 turns on so that the high voltage is supplied from the input terminal 10 through the p-channel transistor 33 to the output signal terminal 31. The gate of the p-channel transistor 32 electrically connected to the output signal terminal 31 is applied with the high voltage to cause the p-channel transistor 32 to turn off. The high level voltage is also supplied to the invertor to be inverted into the low level voltage that is subsequently applied to the gate of the n-channel transistor 35 to cause the n-channel transistor 35 to turn off. Accordingly, the output signal terminal 31 has the high voltage $V_{pp}$ when the input terminal 10 receives the constant high voltage. After the substrate voltage $V_{sub}$ of the fifth switching transistor 15 is raised up and then held at the high voltage $V_{pp}$, the voltage level of the input signal terminal 30 is dropped to the ground voltage so that the gate of the n-channel transistor 34 receives the ground voltage to cause the n-channel transistor 34 to turn off. The ground voltage is also supplied from the input signal terminal 30 to the invertor 36 to be inverted into the high level voltage that is subsequently applied to the gate of the n-channel transistor 35 to cause the n-channel transistor 35 to turn on so that the ground voltage is supplied through the n-channel transistor 34 to the output signal terminal 31. The gate of the p-channel transistor 32 electrically connected to the output signal terminal 31 is then applied to the ground voltage to cause the p-channel transistor 32 to turn on so that the constant high voltage $V_{pp}$ is supplied from the input terminal 10 through the p-channel transistor 32 to the gate of the p-channel transistor 33 resulting in that the p-channel transistor then turns off. The output signal terminal 31 therefore has the ground voltage after the substrate voltage $V_{sub}$ of the fifth switching transistor 15 was raised up and then held at the high voltage.

Figure 6A:
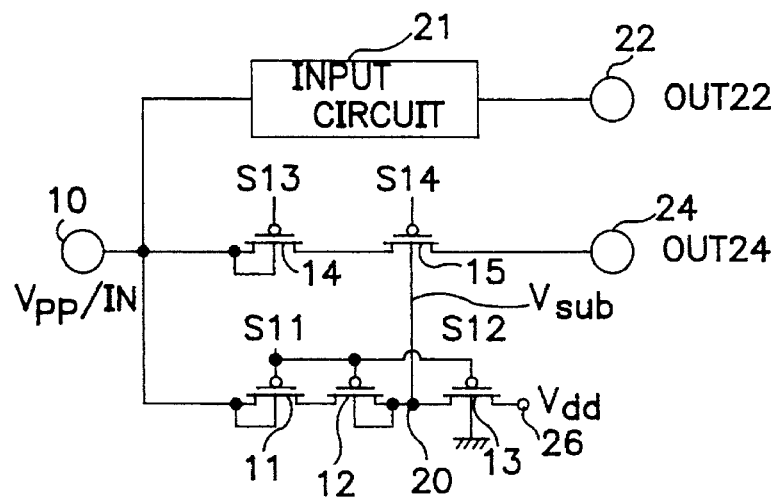
FIG. 6A is a circuit diagram illustrative of a novel transistor circuitry with a single input circuit for receiving both electrical signals and a high voltage in a second embodiment according to the present invention.
Figure 6B:
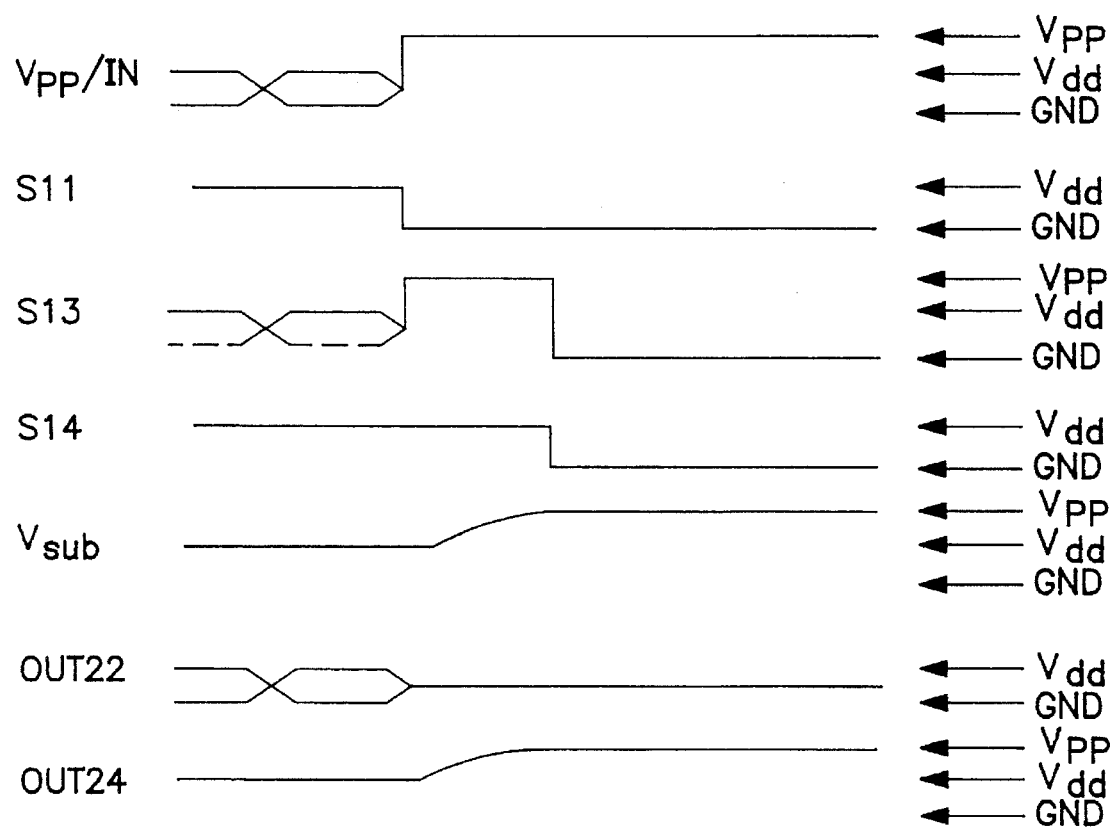
FIG. 6B is a diagram illustrative of voltage waveforms of individual elements involved in the novel transistor circuitry of FIG. 6A.

A second embodiment according to the present invention will be described with reference to FIGS. 6A and 6B in which a novel transistor circuitry with a single input terminal for receiving electrical signals and a high voltage is provided.

The transistor circuitry of the second embodiment is the same as that of the first embodiment except for the third switching transistor 13. The third switching transistor 13 comprises an n-channel transistor whose gate electrode is electrically connected to the gate electrodes of the first and second p-channel transistors 11 and 12 for receiving the first gate control voltage S11. This may provides a further advantage that the above transistor circuitry requires the first, third and fourth gate control voltage signals and never requires the second gate control signal contrary to the first embodiment. When the input terminal 10 receives the input signal, the first gate control signal is held at the high level so that the third n-channel transistor turns on to supply the power source voltage $V_{dd}$ to the substrate of the fifth p-channel transistor 15. By contrast, when the input terminal receives the high voltage $V_{pp}$, the first gate control signal is dropped down to the low level so that the third n-channel transistor 13 turn off. The operations of the third n-channel transistor 13 is the same as those of the first embodiment in view of the switching device.

Accordingly, the novel transistor circuitry of the second embodiment may provide not only the above advantage but also the advantages as mentioned in the first embodiment.

The level shifter as described in the first embodiment may be used in this embodiment to generate the third gate control signal S13.

Figure 7A:
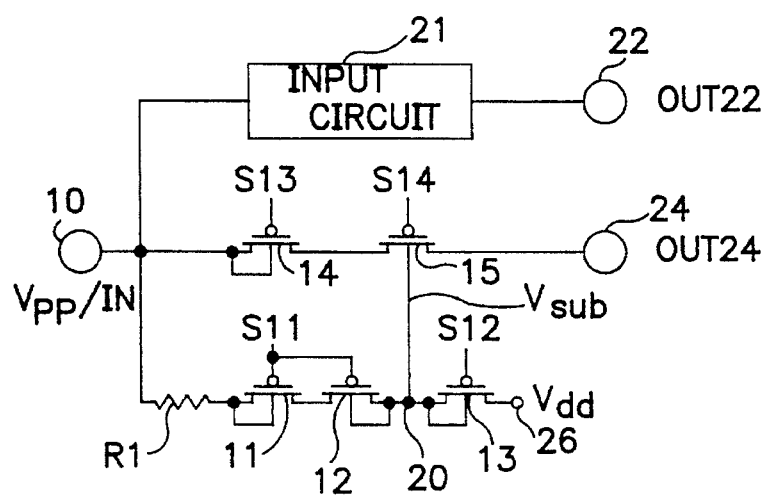
FIG. 7A is a circuit diagram illustrative of a novel transistor circuitry with a single input circuit for receiving both electrical signals and a high voltage in a third embodiment according to the present invention.
Figure 7B:
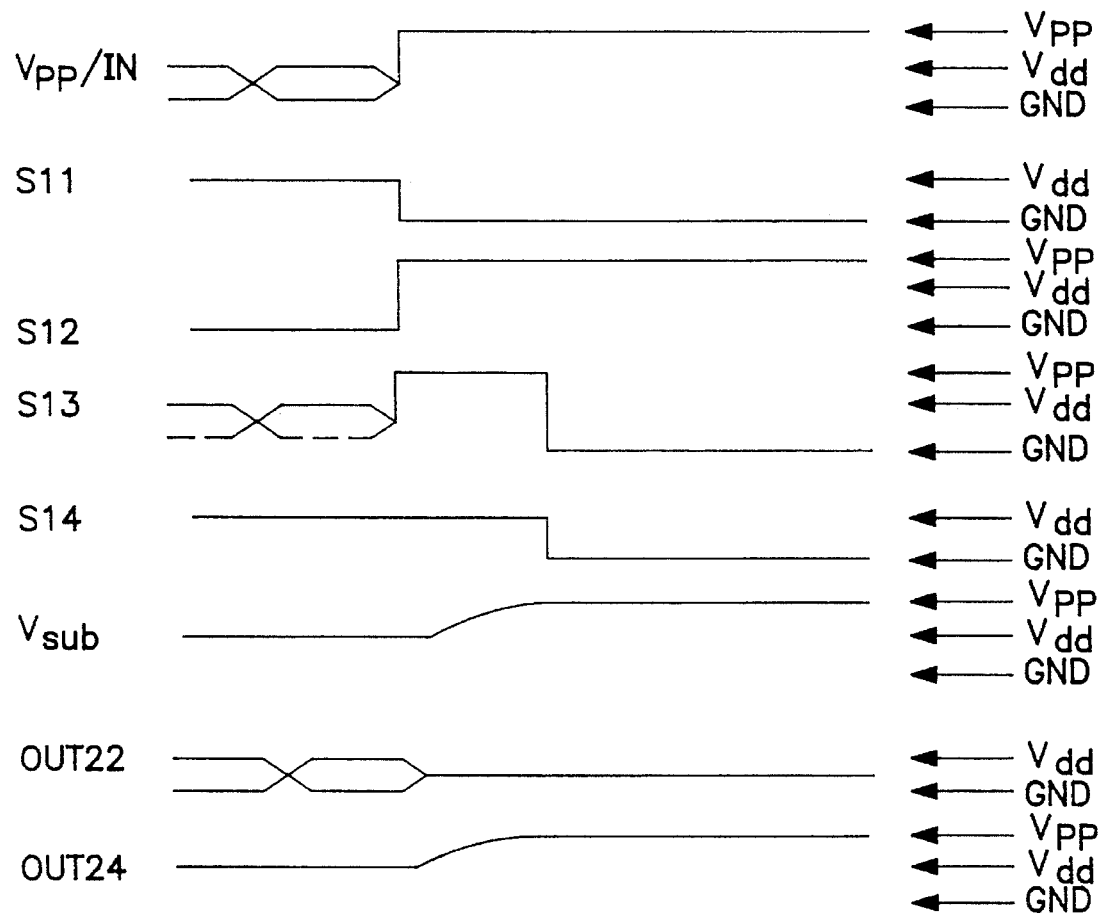
FIG. 7B is a diagram illustrative of voltage waveforms of individual elements involved in the novel transistor circuitry of FIG. 7A.

A third embodiment according to the present invention will be described with reference to FIGS. 7A and 7B in which a novel transistor circuitry with a single input terminal for receiving electrical signals and a high voltage is provided.

The transistor circuitry of the third embodiment is the same as that of the first embodiment except as providing a resistance R1 between the input terminal and the first p-channel transistor. The operations of the transistor circuitry are the same as those of the first embodiment. Then, the transistor circuitry of this embodiment may provide the same advantages as mentioned in the first embodiment. The resistance R1 may further provide an advantage in a stability of the performance of the transistor circuits even when the high voltage applied to the input terminal 10 is varied.

The level shifter as described in the first embodiment may be used in this embodiment to generate the third gate control signal S13.

Figure 8A:
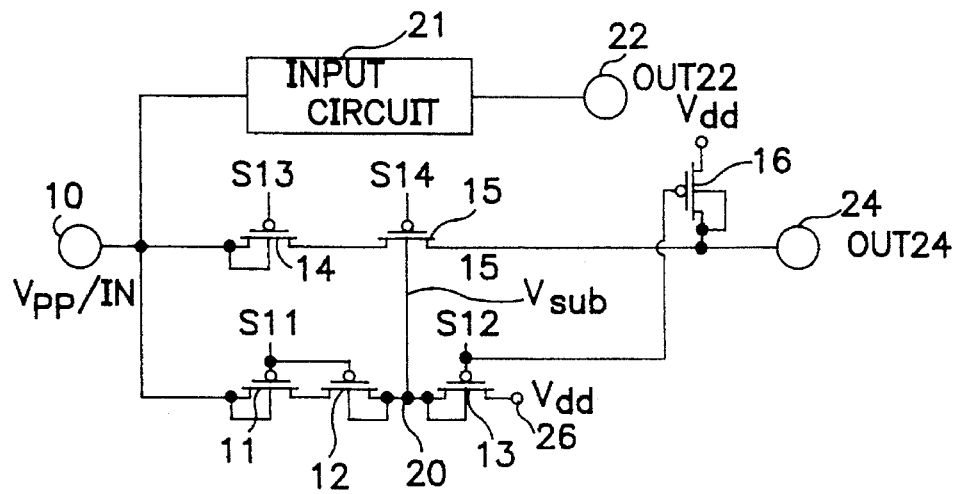
FIG. 8A is a circuit diagram illustrative of a novel transistor circuitry with a single input circuit for receiving both electrical signals and a high voltage in a fourth embodiment according to the present invention.
Figure 8B:
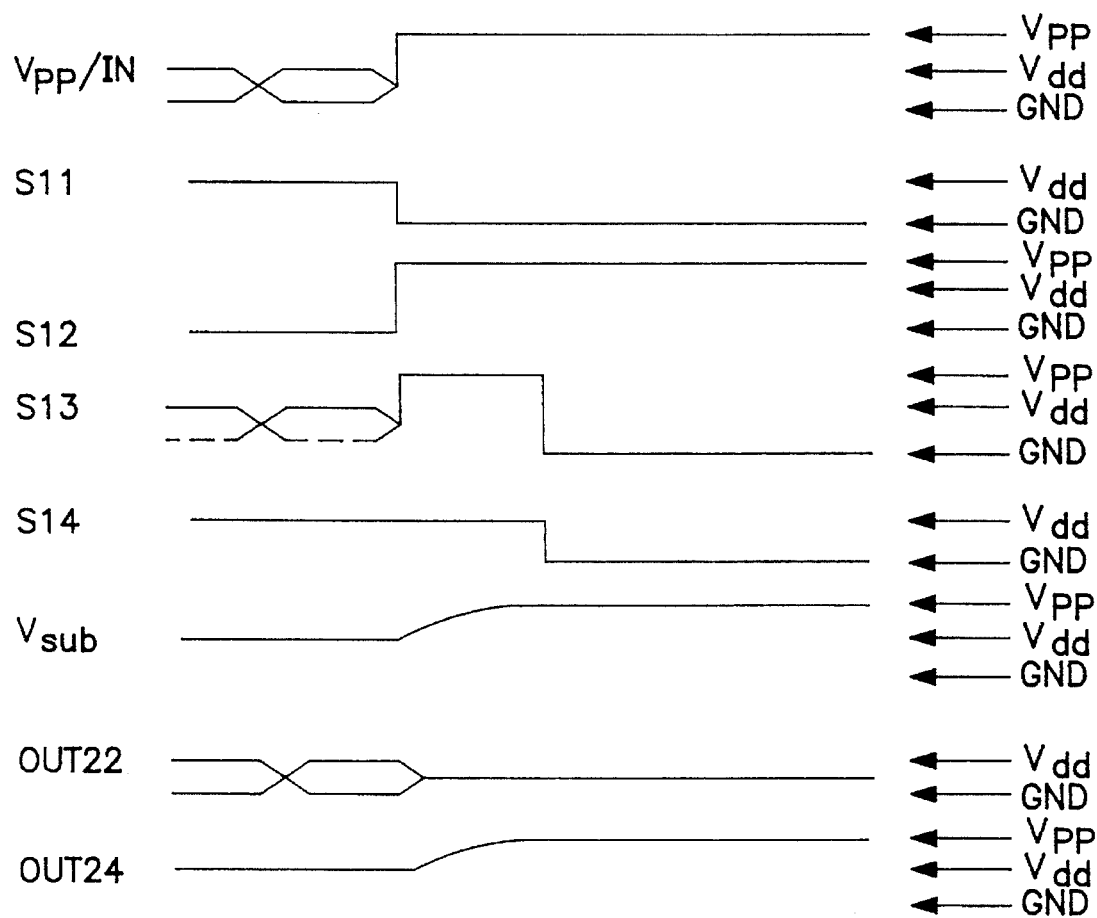
FIG. 8B is a diagram illustrative of voltage waveforms of individual elements involved in the novel transistor circuitry of FIG. 8A.

A fourth embodiment according to the present invention will be described with reference to FIGS. 8A and 8B in which a novel transistor circuitry with a single input terminal for receiving electrical signals and a high voltage is provided.

The transistor circuitry of the fourth embodiment is the same as that of the first embodiment except as providing an extra sixth p-channel transistor 16 between the high voltage output terminal 24 and the power source voltage terminal supplying the power source voltage $V_{dd}$. A gate electrode of the sixth p-channel transistor 16 is electrically connected to the gate of the third p-channel transistor 13 for receiving the second gate control signal S12.

When the input terminal 10 receives the input signal, the second gate control signal S12 is at the low level. The, the p-channel transistor 16 turns on so that the power source voltage $V_{dd}$ is supplied through the sixth p-channel transistor 16 to the high voltage output terminal 24. Accordingly, the voltage of the high voltage output terminal 24 is held at the power source voltage $V_{dd}$ when the input terminal 10 receives the input signal. When the input terminal 10 receives the high voltage $V_{pp}$, the second gate control signal is in the high level. Then, the sixth p-channel transistor 16 turns off. The operations of the remaining transistors are the same as those of the first embodiment according to the present invention. Then, the transistor circuitry of this embodiment may provide the same advantages as mentioned in the first embodiment.

The level shifter as described in the first embodiment may be used in this embodiment to generate the second and third gate control signals S12 and S13.

Figure 9A:
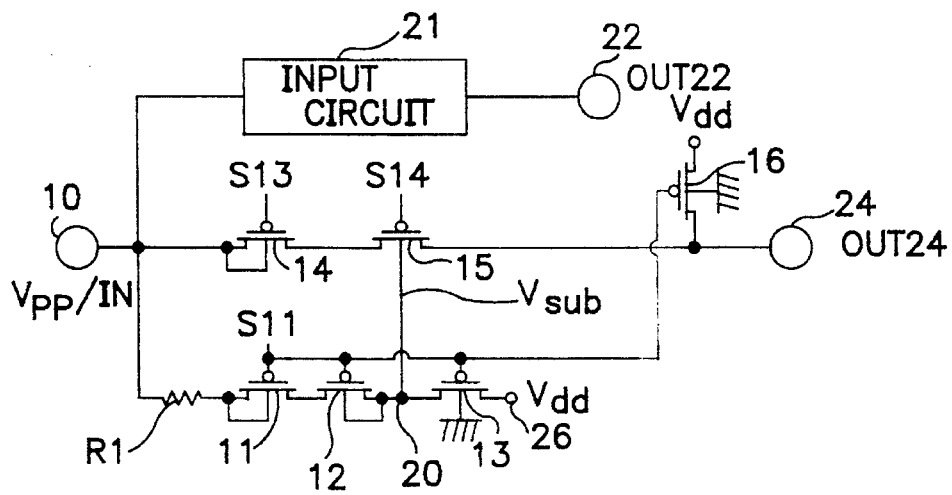
FIG. 9A is a circuit diagram illustrative of a novel transistor circuitry with a single input circuit for receiving both electrical signals and a high voltage in a fifth embodiment according to the present invention.
Figure 9B:
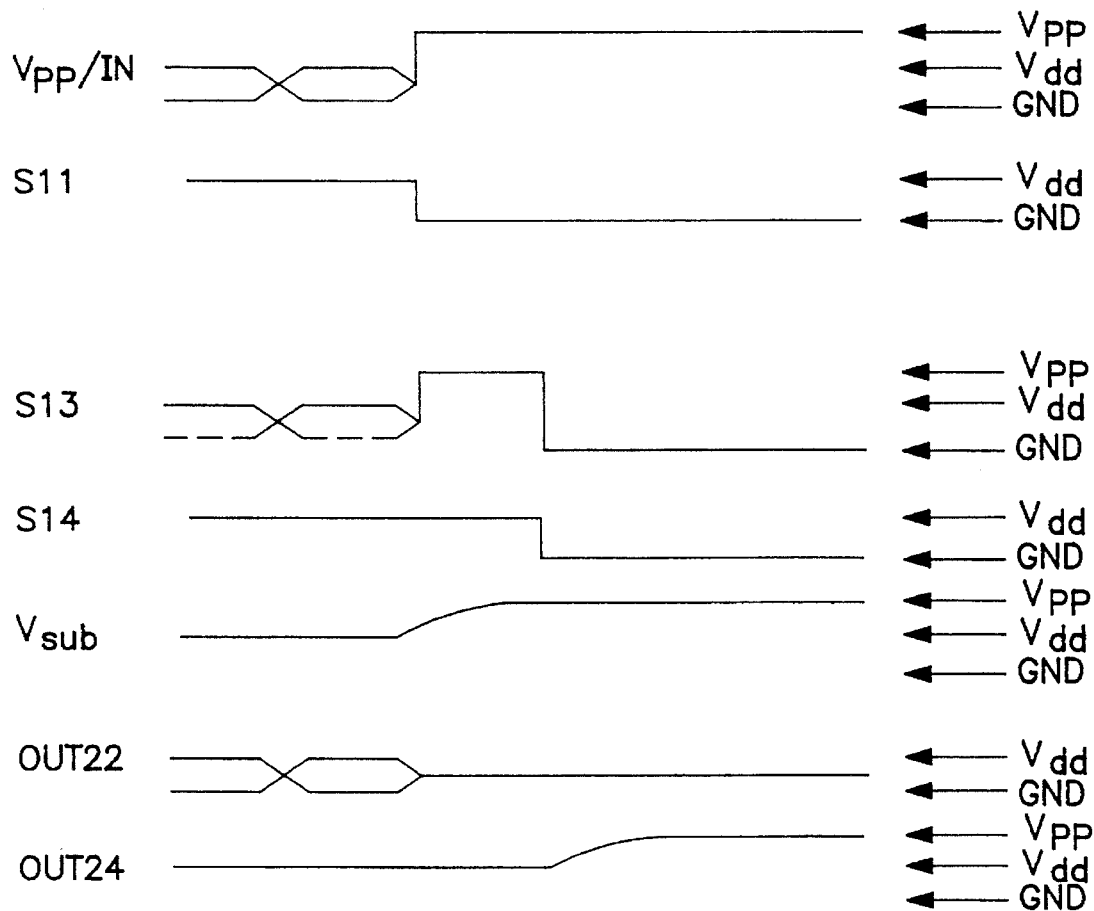
FIG. 9B is a diagram illustrative of voltage waveforms of individual elements involved in the novel transistor circuitry of FIG. 9A.

A fifth embodiment according to the present invention will be described with reference to FIGS. 9A and 9B in which a novel transistor circuitry with a single input terminal for receiving electrical signals and a high voltage is provided.

The transistor circuitry of the fifth embodiment is the same as that of the first embodiment except as providing a resistance R1, a third n-channel transistor 13 and an extra sixth n-channel transistor 16. The resistance R1 is provided between the input terminal 10 and the first p-channel transistor 11. The resistance R1 may further provide an advantage in a stability of the performance of the transistor circuits even when the high voltage applied to the input terminal 10 is varied. The third switching transistor 13 comprises an n-channel transistor whose gate electrode is electrically connected to the gate electrodes of the first and second p-channel transistors 11 and 12 for receiving the first gate control voltage S11. A gate of the sixth n-channel transistor 16 is also electrically connected to the gate electrode of the first and second p-channel transistors 11 and 12 for receiving the first gate control signal S11. This may provide a further advantage in that the above transistor circuitry requires the first, third and fourth gate control voltage signals and never requires the second gate control signal contrary to the first embodiment. When the input terminal 10 receives the input signal, the first gate control signal is held at the high level so that the third and sixth n-channel transistors 13 and 16 turn on to supply the power source voltage $V_{dd}$ to the high voltage output terminal 24 and the substrate of the fifth p-channel transistor 15. Accordingly, the voltage of the high voltage output terminal 24 is held at the power source voltage $V_{dd}$ when the input terminal 10 receives the input signal. By contrast, when the input terminal receives the high voltage $V_{pp}$, the first gate control signal is dropped down to the low level so that the third and sixth n-channel transistors 13 turn off.

The operation of the above transistor circuitry is the same as that of the first embodiment. Then, the transistor circuitry of this embodiment may provide the same advantages as mentioned in the first embodiment.

The level shifter as described in the first embodiment may be used in this embodiment to generate the second and third gate control signals S12 and S13.

Figure 10A:
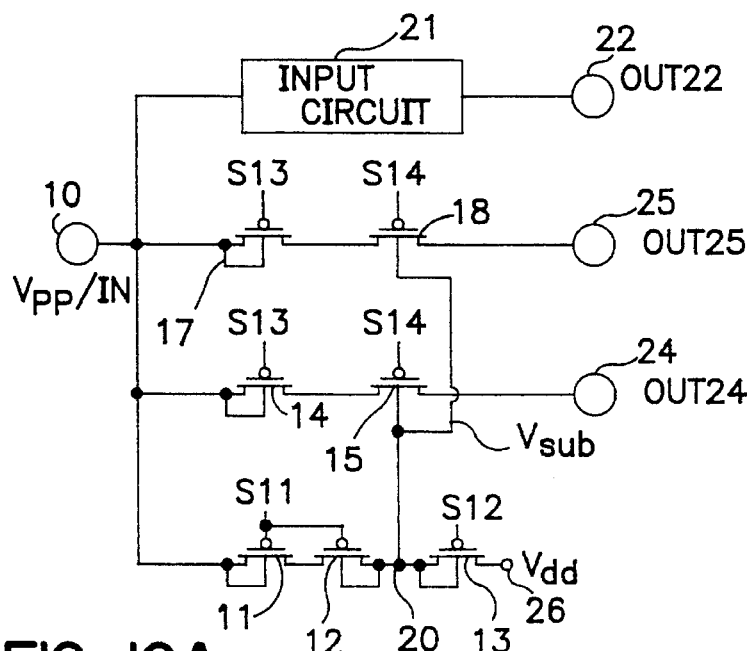
FIG. 10A is a circuit diagram illustrative of a novel transistor circuitry with a single input circuit for receiving both electrical signals and a high voltage in a sixth embodiment according to the present invention.
Figure 10B:
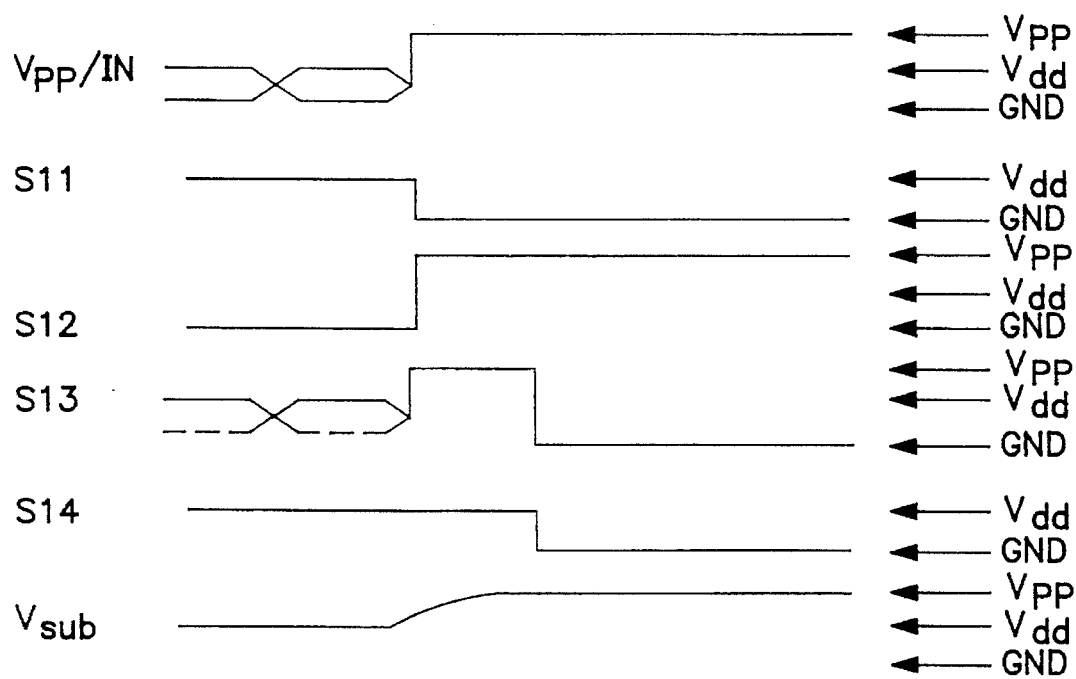
FIG. 10B is a diagram illustrative of voltage waveforms of individual elements involved in the novel transistor circuitry of FIG. 10A.

A sixth embodiment according to the present invention will be described with reference to FIGS. 10A and 10B in which a novel transistor circuitry with a single input terminal for receiving electrical signals and a high voltage is provided.

The transistor circuitry of the sixth embodiment is the same as that of the first embodiment except as providing an extra third high voltage output terminal 25, a pair of seventh and eighth p-channel transistors 17 and 18 electrically connected between the input terminal 10 and the extra third high voltage output terminal 25. The seventh p-channel transistor has a substrate that is electrically connected to the input terminal 10, while the eighth p-channel transistor 18 has a gate that is electrically connected to the intersection 20. The operations of the seventh and eighth p-channel transistors 17 and 18 are the same as the fourth and fifth p-channel transistors 14 and 15. Then, the voltage of the extra third high voltage output terminal 25 is the same as the voltage of the second high voltage output terminal 24. The second and third high voltage output terminals are provided for separately driving two different circuits. Then, even if any one of the circuits has a variation in the resistance, the other circuit may perform the operation with stability.

The operation of the above transistor circuitry is the same as that of the first embodiment. Then, the transistor circuitry of this embodiment may provide the same advantages as mentioned in the first embodiment.

The level shifter as described in the first embodiment may be used in this embodiment to generate the second and third gate control signals S12 and S13.

Figure 11A:
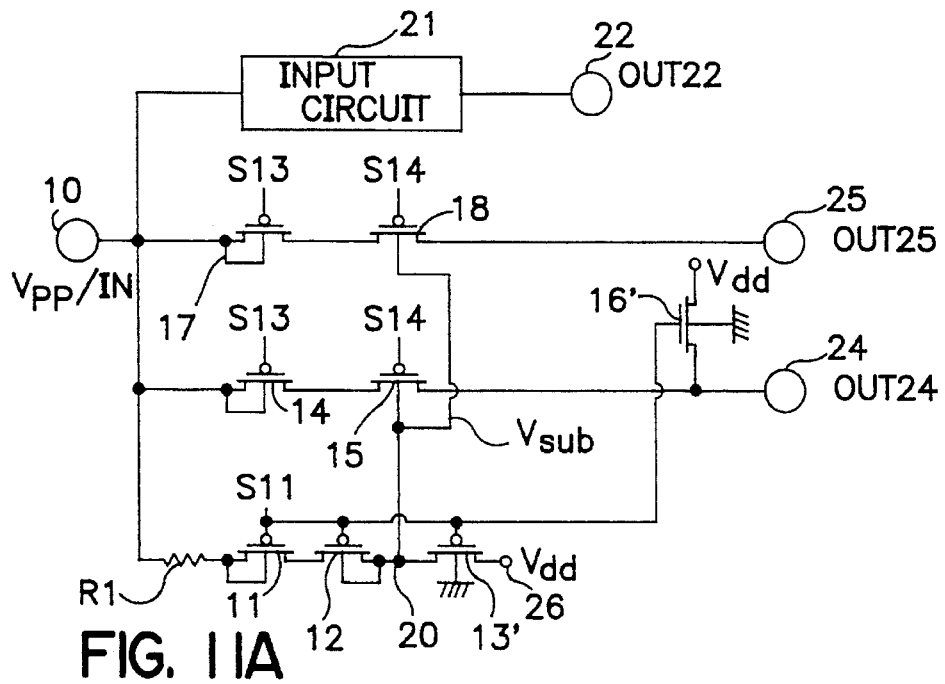
FIG. 11A is a circuit diagram illustrative of a novel transistor circuitry with a single input circuit for receiving both electrical signals and a high voltage in a seventh embodiment according to the present invention.
Figure 11B:
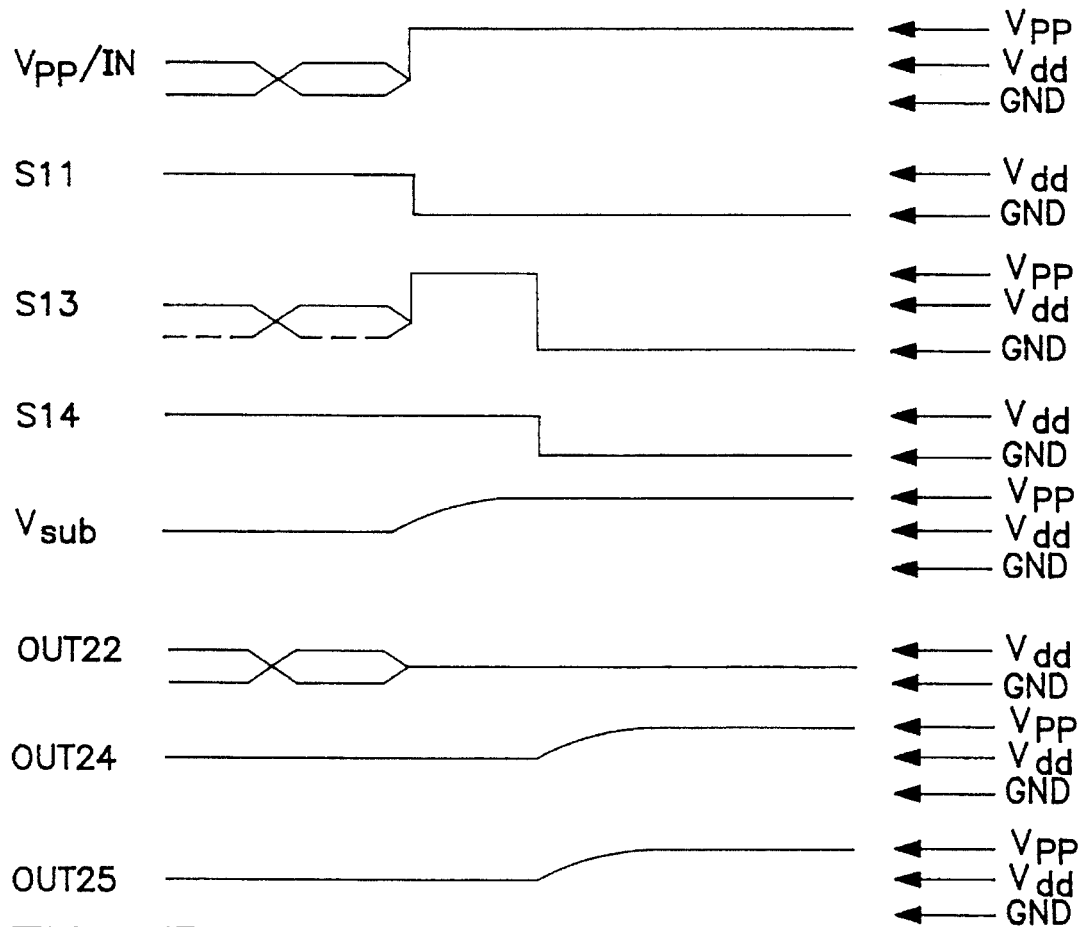
FIG. 11B is a diagram illustrative of voltage waveforms of individual elements involved in the novel transistor circuitry of FIG. 11A.

A seventh embodiment according to the present invention will be described with reference to FIGS. 11A and 11B in which a novel transistor circuitry with a single input terminal for receiving electrical signals and a high voltage is provided.

The transistor circuitry of the seventh embodiment is the same as that of the first embodiment except as providing a resistance R1, a third n-channel transistor 13 and an extra sixth n-channel transistor 16 as well as providing an extra third high voltage output terminal 25, a pair of seventh and eighth p-channel transistors 17 and 18 electrically connected between the input terminal 10 and the extra third high voltage output terminal 25. The seventh p-channel transistor has a substrate that is electrically connected to the input terminal 10, while the eighth p-channel transistor 18 has a gate that is electrically connected to the intersection 20. The operations of the seventh and eighth p-channel transistors 17 and 18 are the same as the fourth and fifth p-channel transistors 14 and 15. Then, the voltage of the extra third high voltage output terminal 25 is the same as the voltage of the second high voltage output terminal 24. The second and third high voltage output terminals are provided for separately driving two different circuits. Then, even if any one of the circuits has a variation in the resistance, the other circuit may perform the operation with stability. The resistance R1 is provided between the input terminal 10 and the first p-channel transistor 11. The resistance R1 may further provide an advantage in a stability of the performance of the transistor circuits even when the high voltage applied to the input terminal 10 is varied. The third switching transistor 13 comprises an n-channel transistor whose gate electrode is electrically connected to the gate electrodes of the first and second p-channel transistors 11 and 12 for receiving the first gate control voltage S11. A gate of the sixth n-channel transistor 16 is also electrically connected to the gate electrodes of the first and second p-channel transistors 11 and 12 for receiving the first gate control signal S11. This may provides a further advantage that the above transistor circuitry requires the first, third and fourth gate control voltage signals and never require the second gate control signal contrary to the first embodiment. When the input terminal 10 receives the input signal, the first gate control signal is held at the high level so that the third and sixth n-channel transistors 13 and 16 turn on to supply the power source voltage $V_{dd}$ to the high voltage output terminal 24 and the substrate of the fifth p-channel transistor 15. Accordingly, the voltage of the high voltage output terminal 24 is held at the power source voltage $V_{dd}$ when the input terminal 10 receives the input signal. By contrast, when the input terminal receives the high voltage $V_{pp}$, the first gate control signal is dropped down to the low level so that the third and sixth n-channel transistors 13 turn off.

The operation of the above transistor circuitry is the same as that of the first embodiment. Then, the transistor circuitry of this embodiment may provide the same advantages as mentioned in the first embodiment.

The level shifter as described in the first embodiment may be used in this embodiment to generate the second and third gate control signals S12 and S13.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the sprit and scope of the invention.

What is claimed is:

1. A transistor circuitry comprising:

an input terminal for receiving both an input signal having a voltage ranging from a first voltage level to a second voltage level higher than said first voltage level and for subsequently receiving a high constant voltage having a third voltage level higher than said second voltage level;

a first output terminal through which an output signal is outputted;

an input circuit electrically connected between said input terminal and said first output terminal for fetching said input signal from said input terminal and for subsequently supplying said output signal to said output terminal;

a second output terminal through which said high constant voltage having said third voltage level is outputted;

a power source voltage terminal through which a power source voltage having a same voltage level as said second voltage level is supplied;

a control circuit electrically connected between said input terminal and said power source voltage terminal for generating a substrate control voltage that is held at said second voltage level upon receipt of said input signal by said input terminal and that is subsequently gradually increased up to said third voltage level when said input signal switches into said high constant voltage to hold said substrate control voltage at said third voltage level;

a first switching transistor electrically connected to said second output terminal, said first switching transistor having a substrate that is electrically connected to said control circuit for receiving said substrate control voltage; and a second switching transistor electrically connected between said input terminal and said first switching transistor to transmit said high constant voltage from said input terminal through said first and second switching transistors to said second output terminal wherein said second switching transistor is controlled to be held in an off state to prevent said first switching transistor from receiving said high constant voltage until said substrate control voltage is raised up to and held at said third voltage level.

2. The transistor circuitry as claimed in claim 1, wherein said first switching transistor is controlled to be held in an off state until said substrate control voltage is raised up to and held at said third voltage level.

3. The transistor circuitry as claimed in claim 1, wherein said first and second transistors are p-channel transistors.

4. The transistor circuitry as claimed in claim 3, wherein said first switching transistor receives a first gate control signal that is held at a high level corresponding to said second voltage level until said substrate control voltage is raised up to and held at said third voltage level said first gate control signal subsequently being shifted to a low level corresponding to said first voltage level.

5. The transistor circuitry as claimed in claim 3, wherein said second switching transistor receives a second gate control signal having a various voltage level that is not higher than said second voltage level but higher than a threshold voltage of said second switching transistor to keep said second switching transistor turned off, said second gate control signal subsequently being shifted to said third voltage level to further maintain said off state of said second switching transistor until said substrate control voltage is raised up to and held at said third voltage level, followed by a drop of said voltage level of said second gate control signal down to said first voltage level.

6. The transistor circuitry as claimed in claim 1, wherein said second switching transistor has a substrate that is electrically connected to said input terminal.

7. The transistor circuitry as claimed in claim 1, further comprising:
   a third output terminal through which said high constant voltage having said third voltage level is outputted;
   a third switching transistor electrically connected to said second output terminal, said third switching transistor having a substrate that is electrically connected to said control circuit for receiving said substrate control voltage; and
   a fourth switching transistor electrically connected between said input terminal and said third switching transistor to transmit said high constant voltage from said input terminal through said third and fourth switching transistors to said third output terminal wherein said fourth switching transistor is controlled to be held in an off state to prevent said third switching transistor from receiving said high constant voltage until said substrate control voltage is raised up to and held at said third voltage level.

8. The transistor circuitry as claimed in claim 7, wherein said third switching transistor is controlled to be held in an off state until said substrate control voltage is raised up to and held at said third voltage level.

9. The transistor circuitry as claimed in claim 7, wherein said third and fourth transistors are p-channel transistors.

10. The transistor circuitry as claimed in claim 9, wherein said third switching transistor receives a third gate control signal that is held at a high level corresponding to said second voltage level until said substrate control voltage is raised up to and held at said third voltage level, said third gate control signal subsequently being shifted to a low level corresponding to said first voltage level.

11. The transistor circuitry as claimed in claim 9, wherein said fourth switching transistor receives a fourth gate control signal having a various voltage level that is not higher than said second voltage level but higher than a threshold voltage of said fourth switching transistor to maintain said fourth switching transistor turned off, said fourth gate control signal subsequently being shifted to said third voltage level to further maintain said off state of said fourth switching transistor until said substrate control voltage is raised up to and held at said third voltage level, said voltage level of said fourth gate control signal subsequently dropping down to said first voltage level.

12. The transistor circuitry as claimed in claim 9, wherein said fourth switching transistor has a substrate that is electrically connected to said input terminal.

13. The transistor circuitry as claimed in claim 1, wherein said control circuit comprises:
   a fifth p-channel transistor electrically connected to said input terminal, said fifth transistor having a substrate that is electrically connected to said input terminal and said fifth transistor receiving a fifth gate control signal to maintain said fifth transistor turned off until said input signal received by said input terminal switches to said high constant voltage to subsequently turn on said fifth transistor;
   a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and
   a seventh p-channel transistor electrically connected between said power source voltage terminal and said substrate of said first switching transistor, said seventh transistor having a substrate that is electrically connected to said substrate of said first switching transistor, said seventh transistor receiving a sixth gate control signal to maintain said seventh transistor on until said input signal received by said input terminal switches to said high constant voltage to subsequently turn off said seventh transistor.

14. The transistor circuitry as claimed in claim 1, wherein said control circuit comprises:
   a fifth p-channel transistor electrically connected to said input terminal, said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;
   a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and
   a seventh n-channel transistor electrically connected between said power source voltage terminal and said substrate of said first switching transistor, said seventh transistor having a substrate that is electrically connected to a ground line, said seventh transistor receiving said fifth gate control signal to maintain said seventh transistor turned on until said input signal received by said input terminal switches to said high constant voltage to subsequently turn off said seventh transistor.

15. The transistor circuitry as claimed in claim 1, wherein said control circuit comprises:

a resistance electrically connected to said input terminal;

a fifth p-channel transistor electrically connected to said resistance, said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and a seventh n-channel transistor electrically connected between said power source voltage terminal and said substrate of said first switching transistor, said seventh transistor having a substrate that is electrically connected to a ground line, said seventh transistor receiving said fifth gate control signal to maintain said seventh transistor turned on until said input signal received by said input terminal switches to said high constant voltage to subsequently turn off said seventh transistor.

16. The transistor circuitry as claimed in claim 1, wherein said control circuit comprises:

a fifth p-channel transistor electrically connected to said input terminal said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor;

a seventh p-channel transistor electrically connected between said power source voltage terminal and said substrate of said first switching transistor, said seventh transistor having a substrate that is electrically connected to said substrate of said first switching transistor, said seventh transistor receiving a sixth gate control signal to maintain said seventh transistor turned on until said input signal received by said input terminal switches to said high constant voltage to subsequently turn off said seventh transistor; and an eighth p-channel transistor electrically connected between said second output terminal and a power source voltage line having said second voltage level, said eighth transistor having a substrate electrically connected to said second output terminal and having a gate electrically connected to a gate of said seventh p-channel transistor.

17. The transistor circuitry as claimed in claim 1, wherein said control circuit comprises:

a resistance electrically connected to said input terminal;

a fifth p-channel transistor electrically connected to said resistance, said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor;

a seventh n-channel transistor electrically connected between said power source voltage terminal and said substrate of said first switching transistor, said seventh transistor having a substrate that is electrically connected to a ground line, said seventh transistor receiving said fifth gate control signal to maintain said seventh transistor turned on until said input signal received by said input terminal switches to said high constant voltage to subsequently turning off said seventh transistor; and an eighth n-channel transistor electrically connected between said second output terminal and a power source voltage line having said second voltage level, said eighth transistor having a substrate electrically connected to said ground line and having a gate electrically connected to gates of said fifth to seventh transistors.

18. The transistor circuitry as claimed in claim 1, wherein said second switching transistor has a gate electrode that is electrically connected to a level shifter for receiving said second gate control signal.

19. The transistor circuitry as claimed in claim 18, wherein said level shifter comprises:

a signal input terminal of said level shifter for inputting an input signal into said level shifter;

a gate control signal output terminal for outputting a gate control signal to be transmitted to said gate electrode of said second switching transistor;

an invertor circuit electrically connected at its input side to said signal input terminal of said level shifter;

a ninth n-channel transistor electrically connected between said gate control signal output terminal and a ground line, said ninth n-channel transistor having a substrate electrically connected to said ground line, said ninth n-channel transistor having a gate electrode electrically connected to an output side of said invertor circuit;

a tenth p-channel transistor electrically connected between said gate control signal output terminal and said input terminal of said transistor circuitry, said tenth p-channel transistor having a substrate electrically connected to said input terminal of said transistor circuitry;

an eleventh n-channel transistor electrically connected between said ground line and a gate of said tenth p-channel transistor, said eleventh n-channel transistor having a substrate electrically connected to said ground line and having a gate electrically connected to said signal input terminal of said level shifter; and a twelfth p-channel transistor electrically connected between said input terminal of said transistor circuitry and said eleventh n-channel transistor, said twelfth p-channel transistor having a substrate electrically connected to said input terminal of said transistor circuitry and having a gate electrically connected to said gate control signal output terminal.

20. A transistor circuitry comprising:

an input terminal for receiving both an input signal having a voltage in the range from a first voltage level and a second voltage level higher than said first voltage level and for subsequently receiving a high constant voltage having a third voltage level higher than said second voltage level;

a first output terminal through which said high constant voltage having said third voltage level is outputted;

a power source voltage terminal through which a power source voltage having the same voltage level as said second voltage level is supplied;

a control circuit electrically connected between said input terminal and said power source voltage terminal for generating a substrate control voltage that is maintained at said second voltage level upon receipt of said input signal by said input terminal and that is subsequently gradually increased up to said third voltage level when said input signal switches to said high constant voltage to hold said substrate control voltage at said third voltage level;

a first switching transistor electrically connected to said first output terminal, said first switching transistor having a substrate that is electrically connected to said control circuit for receiving said substrate control voltage; and a second switching transistor electrically connected between said input terminal and said first switching transistor to transmit said high constant voltage from said input terminal through said first and second switching transistors to said first output terminal wherein said second switching transistor is so controlled as to be held in an off state to prevent said first switching transistor from receiving said high constant voltage until said substrate control voltage is raised up to and held at said third voltage level.

21. The transistor circuitry as claimed in claim 20, wherein said first switching transistor is controlled to be held in an off state until said substrate control voltage is raised up to and held at said third voltage level.

22. The transistor circuitry as claimed in claim 20, wherein said first and second transistors are p-channel transistors.

23. The transistor circuitry as claimed in claim 22, wherein said first switching transistor receives a first gate control signal that is held at a high level corresponding to said second voltage level until said substrate control voltage is raised up to and held at said third voltage level, said first gate control signal subsequently being shifted to a low level corresponding to said first voltage level.

24. The transistor circuitry as claimed in claim 22, wherein said second switching transistor receives a second gate control signal having a various voltage level that is not higher than said second voltage level but higher than a threshold voltage of said second switching transistor to maintain said second switching transistor turned off, said second gate control signal being subsequently shifted to said third voltage level to further maintain said off state of said second switching transistor until said substrate control voltage is raised up to and held at said third voltage level, said voltage level of said second gate control signal subsequently dropping down to said first voltage level.

25. The transistor circuitry as claimed in claim 20, wherein said second switching transistor has a substrate that is electrically connected to said input terminal.

26. The transistor circuitry as claimed in claim 20, further comprising:

a third output terminal through which said high constant voltage having said third voltage level is outputted;

a third switching transistor electrically connected to said first output terminal, said third switching transistor having a substrate that is electrically connected to said control circuit for receiving said substrate control voltage; and a fourth switching transistor electrically connected between said input terminal and said third switching transistor to transmit said high constant voltage from said input terminal through said third and fourth switching transistors to said third output terminal wherein said fourth switching transistor is controlled to be held in an off state to prevent said third switching transistor from receiving said high constant voltage until said substrate control voltage is raised up to and held at said third voltage level.

27. The transistor circuitry as claimed in claim 26, wherein said third switching transistor is controlled to be held in an off state until said substrate control voltage is raised up to and held at said third voltage level.

28. The transistor circuitry as claimed in claim 26, wherein said third and fourth transistors are p-channel transistors.

29. The transistor circuitry as claimed in claim 28, wherein said third switching transistor receives a third gate control signal that is held at a high level corresponding to said second voltage level until said substrate control voltage is raised up to and held at said third voltage level, said third gate control signal subsequently being shifted to a low level corresponding to said first voltage level.

30. The transistor circuitry as claimed in claim 28, wherein said fourth switching transistor receives a fourth gate control signal having a various voltage level that is not higher than said second voltage level but higher than a threshold voltage of said fourth switching transistor to maintain said fourth switching transistor turned off, said fourth gate control signal being subsequently shifted to said third voltage level to further maintain said off state of said fourth switching transistor until said substrate control voltage is raised up to and held at said third voltage level, said fourth gate control signal subsequently dropping down to said first voltage level.

31. The transistor circuitry as claimed in claim 28, wherein said fourth switching transistor has a substrate that is electrically connected to said input terminal.

32. The transistor circuitry as claimed in claim 20, wherein said control circuit comprises:

a fifth p-channel transistor electrically connected to said input terminal said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and a seventh p-channel transistor electrically connected between said power source voltage terminal and said substrate of said first switching transistor, said seventh transistor having a substrate that is electrically connected to said substrate of said first switching transistor, said seventh transistor receiving a sixth gate control signal to maintain said seventh transistor turned on until said input signal received by said input terminal switches to said high constant voltage to subsequently turn off said seventh transistor.

33. The transistor circuitry as claimed in claim 20, wherein said control circuit comprises:

a fifth p-channel transistor electrically connected to said input terminal said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and a seventh n-channel transistor electrically connected between said power source voltage terminal and said substrate of said first switching transistor, said seventh transistor having a substrate that is electrically connected to a ground line, said seventh transistor receiving said fifth gate control signal to maintain said seventh transistor turned on until said input signal received by said input terminal switches to said high constant voltage to subsequently turn off said seventh transistor.

34. The transistor circuitry as claimed in claim 20, wherein said control circuit comprises:

a resistance electrically connected to said input terminal;

a fifth p-channel transistor electrically connected to said resistance, said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and a seventh n-channel transistor electrically connected between said power source voltage terminal and said substrate of said first switching transistor, said seventh transistor having a substrate that is electrically connected to a ground line, said seventh transistor receiving said fifth gate control signal to maintain said seventh transistor turned on until said input signal received by said input terminal switches to said high constant voltage to subsequently turning off said seventh transistor.

35. The transistor circuitry as claimed in claim 20, wherein said control circuit comprises:

a fifth p-channel transistor electrically connected to said input terminal said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and a seventh p-channel transistor electrically connected between said power source voltage terminal and said substrate of said first switching transistor, said seventh transistor having a substrate that is electrically connected to said substrate of said first switching transistor, said seventh transistor receiving a sixth gate control signal to maintain said seventh transistor turned on until said input signal received by said input terminal switches to said high constant voltage to subsequently turn off said seventh transistor; and an eighth p-channel transistor electrically connected between said first output terminal and a power source voltage line having said second voltage level, said eighth transistor having a substrate electrically connected to said first output terminal and having a gate electrically connected to a gate of said seventh p-channel transistor.

36. The transistor circuitry as claimed in claim 20, wherein said control circuit comprises:

a resistance electrically connected to said input terminal;

a fifth p-channel transistor electrically connected to said resistance, said fifth transistor having a substrate that is electrically connected to said input terminal, said fifth transistor receiving a fifth gate control signal to maintain said fifth transistor turned off until said input signal received by said input terminal switches to said high constant voltage to subsequently turn on said fifth transistor;

a sixth p-channel transistor electrically connected between said fifth transistor and said substrate of said first switching transistor, said sixth transistor having a substrate that is electrically connected to said substrate of said first switching transistor, said sixth transistor receiving said fifth gate control signal to maintain said sixth transistor turned off until said input signal received by said input terminal switches to said high constant voltage to subsequently turn on said sixth transistor; and a seventh n-channel transistor electrically connected between said power source voltage terminal and said substrate of said first switching transistor, said seventh transistor having a substrate that is electrically connected to a ground line, said seventh transistor receiving said fifth gate control signal to maintain said seventh transistor turned on until said input signal received by said input terminal switches to said high constant voltage to subsequently turning off said seventh transistor; and an eighth n-channel transistor electrically connected between said first output terminal and a power source voltage line having said second voltage level, said eighth transistor having a substrate electrically connected to said ground line and having a gate electrically connected to gates of said fifth to seventh transistors.

37. The transistor circuitry as claimed in claim 20, wherein said second switching transistor has a gate electrode that is electrically connected to a level shifter for receiving said second gate control signal.

38. The transistor circuitry as claimed in claim 37, wherein said level shifter comprises:

a signal input terminal of said level shifter for inputting an input signal into said level shifter;

a gate control signal output terminal for outputting a gate control signal to be transmitted to said gate electrode of said second switching transistor;

an invertor circuit electrically connected at its input side to said signal input terminal of said level shifter;

a ninth n-channel transistor electrically connected between said gate control signal output terminal and a ground line, said ninth n-channel transistor having a substrate electrically connected to said ground line, said ninth n-channel transistor having a gate electrode electrically connected to an output side of said invertor circuit;

a tenth p-channel transistor electrically connected between said gate control signal output terminal and said input terminal of said transistor circuitry, said tenth p-channel transistor having a substrate electrically connected to said input terminal of said transistor circuitry;

an eleventh n-channel transistor electrically connected between said ground line and a gate tenth p-channel transistor, said eleventh n-channel transistor having a substrate electrically connected to said ground line and having a gate electrically connected to said signal input terminal of said level shifter; and a twelfth p-channel transistor electrically connected between said input terminal of said transistor circuitry and said eleventh n-channel transistor, said twelfth p-channel transistor having a substrate electrically connected to said input terminal of said transistor circuitry and having a gate electrically connected to said gate control signal output terminal.

* * * * *